US008956895B2

(12) United States Patent
Yamazaki et al.

(10) Patent No.: US 8,956,895 B2
(45) Date of Patent: Feb. 17, 2015

(54) LIGHT EMITTING DEVICE

(75) Inventors: Shunpei Yamazaki, Tokyo (JP); Takeshi Fukunaga, Kanagawa-ken (JP); Jun Koyama, Kanagawa-ken (JP); Kazutaka Inukai, Kanagawa-ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 603 days.

(21) Appl. No.: 12/540,436

(22) Filed: Aug. 13, 2009

(65) Prior Publication Data
US 2009/0298210 A1    Dec. 3, 2009

Related U.S. Application Data

(63) Continuation of application No. 09/841,156, filed on Apr. 25, 2001, now Pat. No. 7,579,203.

(30) Foreign Application Priority Data

Apr. 25, 2000    (JP) .................................. 2000-124019

(51) Int. Cl.
H01L 21/00    (2006.01)
H01L 27/32    (2006.01)
H01L 33/44    (2010.01)

(52) U.S. Cl.
CPC ........... *H01L 27/322* (2013.01); *H01L 27/3244* (2013.01); *H01L 27/3281* (2013.01); *H01L 33/44* (2013.01)
USPC .................. 438/29; 438/22; 257/E21.002

(58) Field of Classification Search
USPC ............................ 438/22–47, 7; 349/80, 106; 257/E21.001, E21.002
See application file for complete search history.

(56) References Cited

U.S. PATENT DOCUMENTS

| | | |
|---|---|---|
| 4,749,440 A | 6/1988 | Blackwood et al. |
| 4,963,788 A | 10/1990 | King |
| 5,040,875 A | 8/1991 | Noguchi |
| 5,058,997 A | 10/1991 | Dickerson et al. |
| 5,206,749 A | 4/1993 | Zavracky et al. |
| 5,247,190 A | 9/1993 | Friend |
| 5,276,999 A | 1/1994 | Bando |
| 5,317,236 A | 5/1994 | Zavracky et al. |

(Continued)

FOREIGN PATENT DOCUMENTS

| | | |
|---|---|---|
| EP | 0 845 770 A1 | 6/1998 |
| EP | 0 909 972 A2 | 4/1999 |

(Continued)

OTHER PUBLICATIONS

Japanese Patent Application Laid-Open No. 7-130652 (English Abstract attached) Publication Date May 19, 1995.

(Continued)

*Primary Examiner* — Laura Menz
*Assistant Examiner* — Candice Y Chan
(74) *Attorney, Agent, or Firm* — Fish & Richardson P.C.

(57) ABSTRACT

An inexpensive light emitting device and inexpensive electric equipment are provided. A substrate on which a semiconductor element or a light emitting element is formed and a color filter are manufactured by separate manufacturing processes, and they are bonded to each other to complete the light emitting device. Thus, the yield of the light emitting device is improved and the manufacture period is shortened.

30 Claims, 25 Drawing Sheets

(56) References Cited

U.S. PATENT DOCUMENTS

| | | |
|---|---|---|
| 5,317,431 A | 5/1994 | Yoshida |
| 5,376,561 A | 12/1994 | Vu et al. |
| 5,396,304 A | 3/1995 | Salerno |
| 5,399,502 A | 3/1995 | Friend |
| 5,559,397 A | 9/1996 | Tsuruoka |
| 5,643,826 A | 7/1997 | Ohtani |
| 5,654,811 A | 8/1997 | Spitzer et al. |
| 5,693,956 A | 12/1997 | Shi |
| 5,757,126 A | 5/1998 | Harvey, III |
| 5,757,456 A | 5/1998 | Yamazaki |
| 5,781,164 A | 7/1998 | Jacobsen et al. |
| 5,800,952 A | 9/1998 | Urano |
| 5,821,138 A | 10/1998 | Yamazaki |
| 5,834,327 A | 11/1998 | Yamazaki |
| 5,870,157 A | 2/1999 | Shimada |
| 5,916,735 A * | 6/1999 | Nakashima et al. ........... 430/314 |
| 5,923,962 A | 7/1999 | Ohtani |
| 5,929,961 A | 7/1999 | Nishi |
| 6,031,290 A | 2/2000 | Miyazaki |
| 6,043,800 A | 3/2000 | Spitzer et al. |
| 6,127,199 A | 10/2000 | Inoue et al. |
| 6,140,980 A | 10/2000 | Spitzer et al. |
| 6,194,837 B1 | 2/2001 | Ozawa |
| 6,252,253 B1 | 6/2001 | Bao |
| 6,274,887 B1 | 8/2001 | Yamazaki |
| 6,280,559 B1 | 8/2001 | Terada |
| 6,320,204 B1 | 11/2001 | Hirabayashi |
| 6,320,309 B1 | 11/2001 | Nomura |
| 6,346,718 B1 | 2/2002 | Yamanaka |
| 6,372,608 B1 | 4/2002 | Shimoda et al. |
| 6,376,333 B1 | 4/2002 | Yamazaki |
| 6,392,340 B2 | 5/2002 | Yoneda |
| 6,433,486 B1 | 8/2002 | Yokoyama |
| 6,437,769 B1 | 8/2002 | Kobayashi et al. |
| 6,445,005 B1 | 9/2002 | Yamazaki |
| 6,476,783 B2 | 11/2002 | Matthies |
| 6,545,359 B1 | 4/2003 | Ohtani |
| 6,548,960 B2 | 4/2003 | Inukai |
| 6,580,214 B2 | 6/2003 | Yoneda et al. |
| 6,636,185 B1 | 10/2003 | Spitzer |
| 6,730,966 B2 | 5/2004 | Koyama |
| 6,755,983 B2 | 6/2004 | Yudasaka |
| 6,781,152 B2 | 8/2004 | Yamazaki |
| 6,784,457 B2 | 8/2004 | Yamazaki et al. |
| 6,936,846 B2 | 8/2005 | Koyama |
| 7,060,153 B2 * | 6/2006 | Yamazaki et al. ............ 156/249 |
| 7,113,154 B1 | 9/2006 | Inukai |
| 7,119,364 B2 * | 10/2006 | Yamazaki ........................ 257/57 |
| 7,214,555 B2 | 5/2007 | Yamazaki et al. |
| 7,271,858 B2 | 9/2007 | Yamazaki et al. |
| 7,483,091 B1 | 1/2009 | Yamazaki et al. |
| 7,776,663 B2 | 8/2010 | Yamazaki et al. |
| 7,851,797 B2 | 12/2010 | Yamazaki et al. |
| 8,466,482 B2 | 6/2013 | Yamazaki |
| 2001/0015256 A1 | 8/2001 | Yamazaki |
| 2001/0025958 A1 | 10/2001 | Yamazaki |
| 2001/0040645 A1 | 11/2001 | Yamazaki |
| 2002/0021266 A1 | 2/2002 | Koyama |
| 2003/0146712 A1 | 8/2003 | Inukai |
| 2005/0001215 A1 | 1/2005 | Koyama |
| 2007/0082430 A1 | 4/2007 | Yamazaki |
| 2013/0277679 A1 | 10/2013 | Yamazaki |

FOREIGN PATENT DOCUMENTS

| | | |
|---|---|---|
| EP | 0 999 595 | 5/2000 |
| EP | 1 0187 18 A1 | 7/2000 |
| EP | 1 085 576 | 3/2001 |
| EP | 1 103 946 | 5/2001 |
| EP | 1 122 794 A2 | 8/2001 |
| EP | 2 261 978 A1 | 12/2010 |
| GB | 2 319 650 | 5/1998 |
| JP | 60-222822 A | 11/1985 |
| JP | 01-099026 | 4/1989 |
| JP | 05-93806 | 4/1993 |
| JP | 06-148685 | 5/1994 |
| JP | 06-308310 | 11/1994 |
| JP | 07-130652 | 5/1995 |
| JP | 07-235680 | 9/1995 |
| JP | 07-248491 A | 9/1995 |
| JP | 08-96959 | 4/1996 |
| JP | 08-146402 | 6/1996 |
| JP | 08-162269 | 6/1996 |
| JP | 08-262475 A | 10/1996 |
| JP | 08-274336 | 10/1996 |
| JP | 09-63770 | 3/1997 |
| JP | 63-060427 | 3/1998 |
| JP | 10-161104 A | 6/1998 |
| JP | 10-161563 A | 6/1998 |
| JP | 10-321369 A | 12/1998 |
| JP | 11-024604 A | 1/1999 |
| JP | 11-026734 A | 1/1999 |
| JP | 11-191487 A | 7/1999 |
| JP | 11-214151 A | 8/1999 |
| JP | 11-251059 A | 9/1999 |
| JP | 11-271753 A | 10/1999 |
| JP | 11-345688 | 12/1999 |
| JP | 2000-010506 A | 1/2000 |
| JP | 2000-098919 A | 4/2000 |
| JP | 2000-235348 A | 8/2000 |
| JP | 2001-175198 | 6/2001 |
| JP | 2001-290439 A | 10/2001 |
| JP | 2001-331120 | 11/2001 |
| JP | 2004-327269 | 11/2004 |
| KR | 1998-0010576 A | 4/1998 |

OTHER PUBLICATIONS

Japanese Patent Application Laid-Open No. 8-96959 (English Abstract attached) Publication Date Apr. 12, 1996.

Japanese Patent Application Laid-Open No. 9-63770 (English Abstract attached) Publication Date Mar. 7, 1997.

MunPyo Hong et al., "New Approaches to Process Simplification for Large Area and High Resolution TFT-LCD," IDMC 2000, pp. 219-223, Sep. 5, 2000.

M. A. Baldo et al., "Highly Efficient Phosphorescent Emission from Organic Electroluminescent Devices", Nature vol. 395, Sep. 10, 1998, pp. 151-154.

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

Stuart M. Lee. "Lunar Building Materials—Some Considerations on the Use of Inorganic Polymers", http://www.nas.nasa.gov/About/Education/SpaceSettlement/spaceres/V-3.html.

Hermann Schenk et al.; "Polymers for Light Emitting Diodes"; *EuroDisplay '99*; pp. 33-37; Sep. 6, 1999.

MunPyo Hong et al.; "New Approaches to Process Simplification for Large Area and High Resolution TFT-LCD"; *IDMC 2000*; pp. 219-223; Sep. 5, 2000.

Tsutsui et al., "High Quantum Efficiency in Organic Light-Emitting Devices with Iridium-Complex as a Triplet Emissive Center", Japanese Journal of Applied Physics vol. 38, Part 12B, Dec. 15, 1999, pp. L1502-L1504.

Tsutsui et al., "Electroluminescence in Organic Thin Films", Photochemical Processes in Organized Molecular Systems, 1991, pp. 437-450.

U.S. Appl. No. 09/724,387.
U.S. Appl. No. 09/760,499.

* cited by examiner

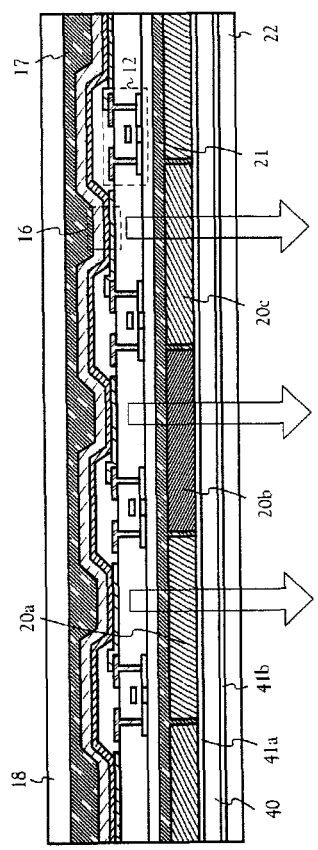
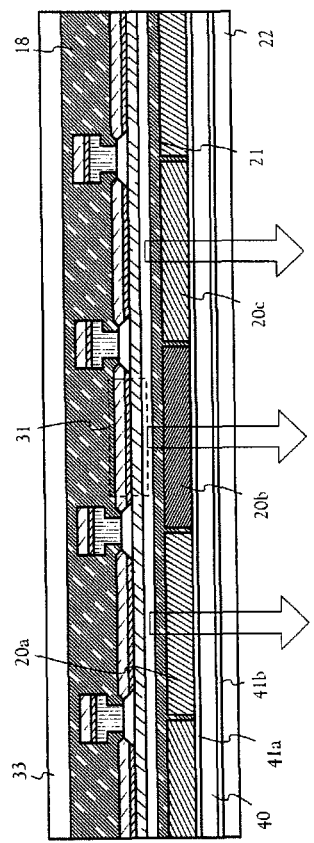
FIG. 4A
FIG. 4B

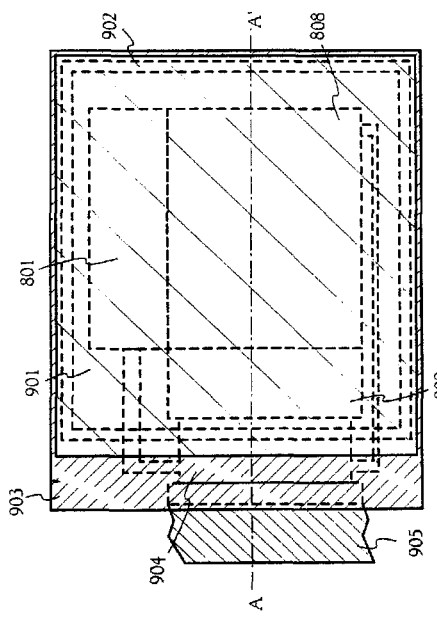
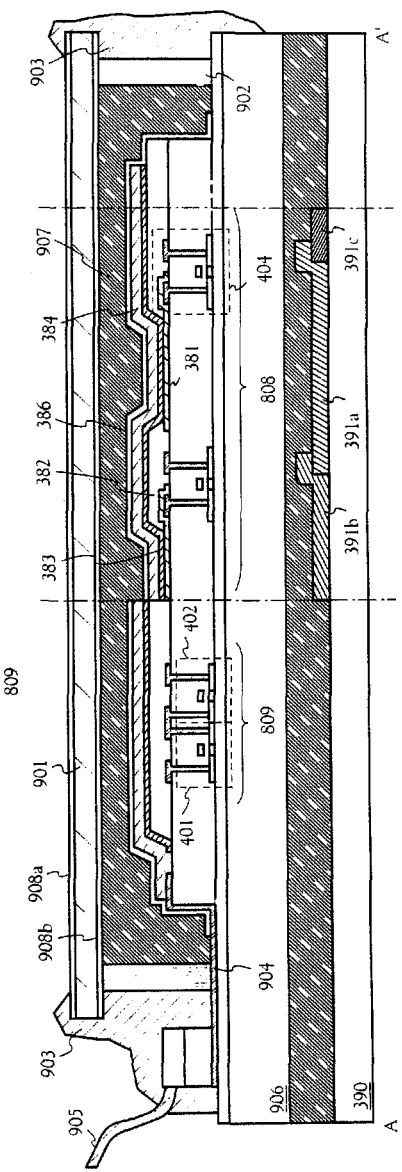
FIG. 12A
FIG. 12B

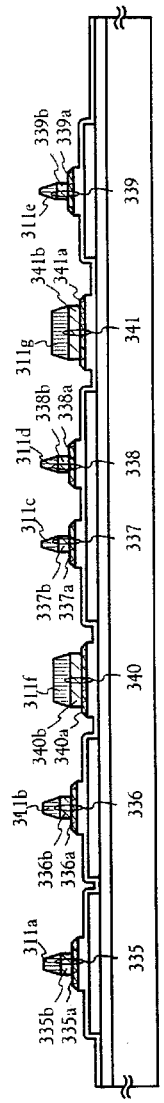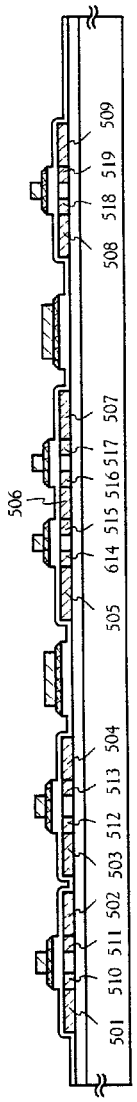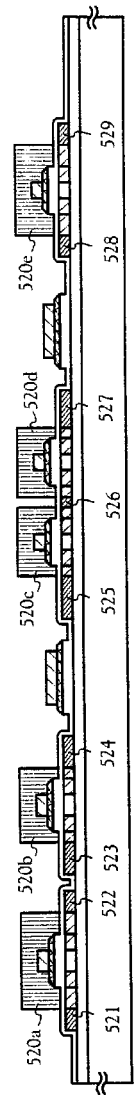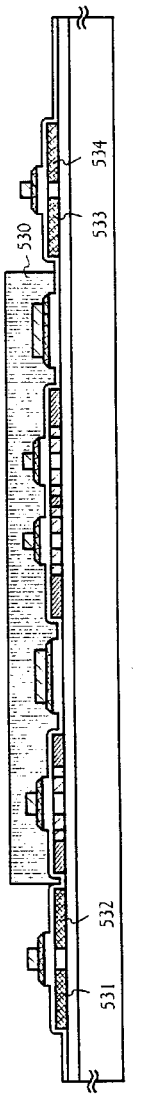
FIG. 17A
FIG. 17B
FIG. 17C
FIG. 17D

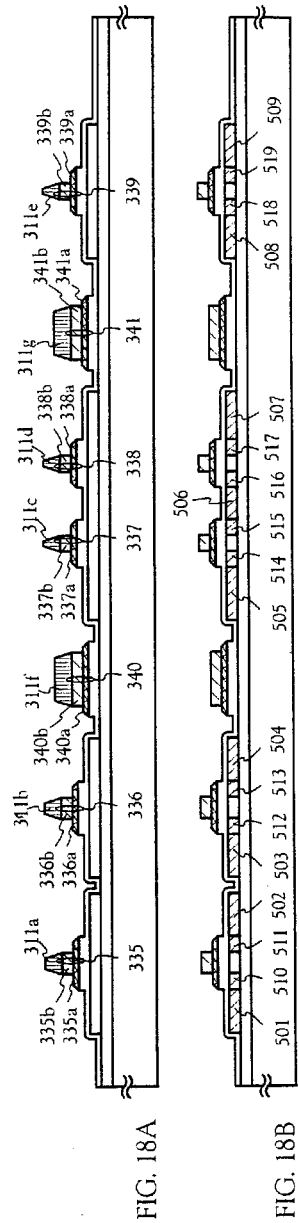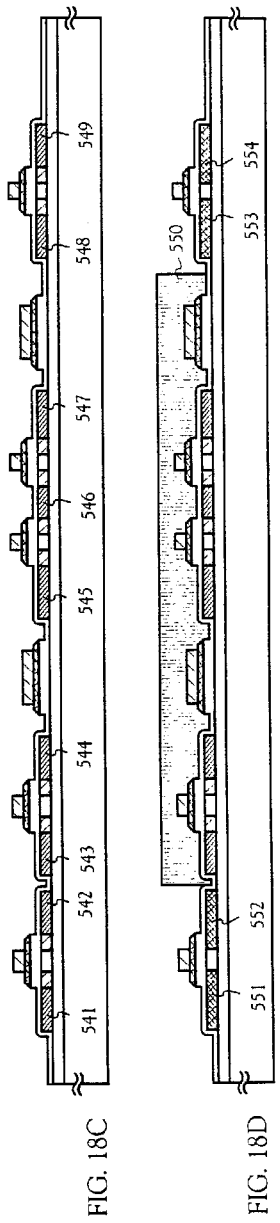

LIGHT EMITTING DEVICE

CROSS-REFERENCE TO RELATED APPLICATIONS

This application is a continuation of U.S. application Ser. No. 09/841,156, filed Apr. 25, 2001, now allowed, which claims the benefit of a foreign priority application filed in Japan as Serial No. 2000-124019 on Apr. 25, 2000, both of which are incorporated by reference.

BACKGROUND OF THE INVENTION

1. Field of the Invention

The present invention relates to a light emitting device having an element in which a light emitting material is interposed between electrodes, and to electric equipment in which the light emitting device is used in a display portion (a display or a display monitor). In particular, the present invention relates to a light emitting device using a light emitting material which provides electro luminescence (EL) (hereinafter referred to as EL material). Note that an organic electro luminescence display and an organic light emitting diode (OLED) are included in the light emitting device of the present invention.

In addition, the light emitting material which can be used in the present invention includes all light emitting materials for producing light emission (phosphorescence and/or fluorescence) through singlet excitation, triplet excitation, or both excitations.

2. Description of the Related Art

Recently, the development of a light emitting device (hereinafter referred to as EL light emitting device) using a light emitting element (hereinafter referred to as EL element) utilizing an EL phenomenon of a light emitting material is progressed. Since the EL light emitting device is a display device using a self light emitting element, a back light which may be used in a liquid crystal display is unnecessary. Also, since the EL light emitting device has a wide view angle, it has been remarked as a display portion of a portable device to be used in an outdoor.

There is a system using a color filter as a system for displaying a color image in the EL light emitting device. For example, an EL element with white color light emission is formed, and then while color light emitted from the EL element is allowed to pass through a colored layer corresponding to R (red), G (green), or B (blue), so that each color light can be obtained.

When such a system is employed, in conventional, a colored layer was provided corresponding to the position of each pixel on a substrate on which an EL element is formed. Thus, it was necessary to perform a photolithography process at least three times.

However, when the photolithography process is performed three times, there arose problems in that not only a manufacturing process of the EL light emitting device is complicated, but also a significant reduction in its yield may be caused, because the yield of individual photolithography process influences by multiplication. As a result, an increase of a manufacturing cost due to the reduction in the yield and an extension of a manufacturing period became a problem.

SUMMARY OF THE INVENTION

The present invention has been made in view of the above problems, and an object of the present invention is therefore to provide a structure of a light emitting device which is not influenced by the yield of a photolithography process for forming a colored layer, and a manufacturing method thereof. Also, another object of the present invention is to provide a light emitting device with a low cost by an improvement of the yield and shortening of a manufacturing period, to thereby reduce the manufacturing cost. Further, another object of the present invention is to provide a low cost electrical apparatus using as a display portion a low cost light emitting device.

In the present invention, by reducing the number of photolithography processes for forming a colored layer, the yield of the light emitting device is improved and the manufacturing period is shortened. Specifically, the present invention is characterized in that a color filter and a substrate on which the light emitting element has been formed are manufactured by a separate manufacturing process, and then both are stuck with each other, so that the light emitting device is completed.

Note that the color fitter represents an optical filter having an individual wavelength sensitive characteristic. That is, an optical filter including a transparent substrate, a colored layer, and a resin layer (overcoat layer), which are used in the present invention may be called the color filter.

According to the present invention, since a manufacturing process for forming the light emitting device and a manufacturing process for forming the colored layer are individually performed, such an advantage is obtained that the yield of the photolithography process for forming the colored layer does not influence the manufacturing process for forming the light emitting device.

BRIEF DESCRIPTION OF THE DRAWINGS

FIGS. 4A and 4B show cross sectional structures of the pixel portion of Embodiment 3;

FIGS. 12A and 12B show a structure of the top surface and a cross sectional structure of the EL light emitting device of Embodiment 4;

FIGS. 17A to 17D show manufacturing processes of the pixel portion and the driver circuit of Embodiment 9;

FIGS. 18A to 18D show manufacturing processes of the pixel portion and the driver circuit of Embodiment 10;

DETAILED DESCRIPTION OF THE PREFERRED EMBODIMENTS

Embodiment Mode

Figure 1A:
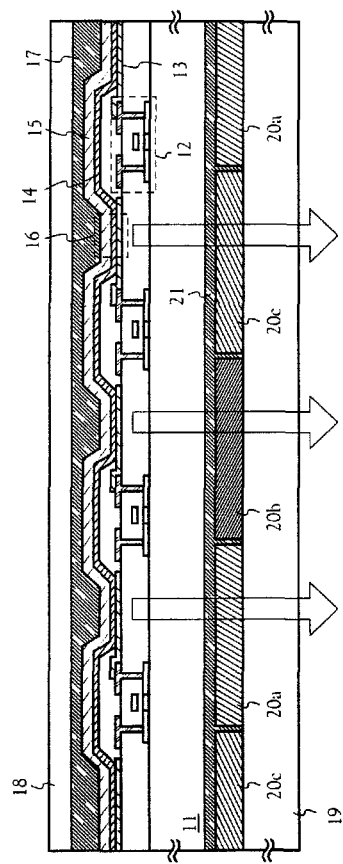
FIGS. 1A and 1B show cross sectional structures of a pixel portion of the present invention.

An embodiment mode of the present invention will be described with reference to FIGS. 1A and 1B. In FIG. 1A, reference numeral 11 denotes a substrate in which an element is formed. If it is a substrate that transmits visual light, any materials may be used therefor. Note that, in this specification, as for the substrate on which the element is formed, the surface of the substrate on which a TFT or an EL element is formed is called a front surface (or a front surface side), and the surface of the substrate in its back side is called a back surface (or a back surface side).

Here, a thin film transistor (hereinafter referred to as TFT) 12 as a semiconductor element is provided on the front surface side of the substrate 11. The TFT 12 is not limited to a specified structure, and thus a top gate type TFT (typically, planer type TFT) or a bottom gate type TFT (typically, inverted stagger type TFT) may be used.

An anode 13 made of an oxide conductive film is connected with the TFT 12, as a pixel electrode. The oxide conductive film used here is transparent with respect to visual light. Light emitted from a light emitting layer is passed through the anode 13 and taken out at the outside. The TFT 12 and the anode 13 are provided to each of a plurality of pixels.

Also, an EL layer 14 is provided in contact with the anode 13. A cathode 15 is provided on the EL layer 14. The EL layer 14 is a layer corresponding to a light emitting portion of the EL element, and is formed with a single layer or a lamination structure. Basically, although the EL layer is used by combining a light emitting layer with a hole injection layer, a hole transportation layer, an electron injection layer, or a electron transportation layer, any structures which are known may be used. Also, an organic material or an inorganic material may be used as a material of the EL element. In the case of the organic material, a polymeric material or a low molecular material may be used.

Also, it is preferred that a material with a small work function is used as the cathode. As the cathode, a metal film containing an element belonging to Group 1 or Group 2 in the periodic table may be used. Of course, any cathode materials which are known may be used.

Note that, in this specification, the EL element represents the anode, an light emitting element including the EL layer and the cathode. Thus, the EL element 16 is formed from the anode 13, the EL layer 14, and the cathode 15.

The EL element 16 is covered with a sealing member 17. A cover member 18 is adhered to the EL element by the sealing member 17. The sealing member 17 is made of a resin, typically, a resin curable with ultraviolet light or an epoxy resin. The sealing member 17 functions as a protective layer for protecting the EL element 16 from water or oxygen.

Also, the cover member 18 functions a protective layer for protecting the EL element 16 from a mechanical shock as well as from water and oxygen. Although any materials may be used as the cover member 18, it is preferred that a plastic substrate is used because of capable of saving the weight of the entire light emitting device.

The structures as described until here are formed on the substrate 11. The substrate 11 after the cover member 18 is provided is called an active matrix substrate in this specification.

Next, a substrate 19 for a color filter, which is different from the active matrix substrate is prepared. If the substrate 19 is a substrate that transmits visual light as the substrate 11, any materials may be used therefor. Note that, in this specification, for the sake of an explanatory convenience, the substrate 19 is called a color filter substrate.

A colored layer (R) 20a, a colored layer (G) 20b, and a colored layer (B) 20c, which each have a thickness of 0.2 to 1.5 μm are provided in a color filter substrate 20. The colored layer is a layer that transmits light with a specified wavelength. As such a layer, a resin film in which pigment is dispersed is used. Note that, in this specification, the colored layer (R) represents a colored layer that transmits a red color light (light having a peak wavelength in the vicinity of 650 nm), the colored layer (G) represents a colored layer that transmits green color light (light in which a peak wavelength is near 550 nm), and the colored layer (B) represents a colored layer that transmits blue color light (light having a peak wavelength in the vicinity of 450 nm).

Also, as the colored layer (R) 20a, the colored layer (G) 20b, and the colored layer (B) 20c, materials used in known color filters may be used. Here, the colored layer (R) 20a that transmits red color light, the colored layer (G) 20b that transmits green color light, and the colored layer (B) 20c that transmits blue color light, are provided.

Note that the colored layer used in the EL light emitting device with a low content of pigment may be used so as to obtain a large amounts of lights. Also, an amount of light can be increased by making a film thickness of the colored layer thin. Further, it is unnecessary to use the colored layer with a sharp peak wavelength as a colored layer used in a liquid crystal display device, and a colored layer with a broad peak wavelength is rather preferred. Besides, when black color pigment is contained in the colored layer, such a defect that an observer is reflected in a cathode can be prevented by absorbing outside light entered from the outside of the EL light emitting device.

Thus, the colored layer (R) 20a, the colored layer (G) 20b, and the colored layer (B) 20c, which are provided on the color filter substrate 19, is stuck to the back surface side of the substrate 11 by the effect of a resin layer 21 provided as an overcoat layer (or leveling layer). It is preferred that the resin layer 21 is formed with a film thickness of 1 to 3 μm (film thickness that the step of the colored layer can be leveled). Thus, the state of FIG. 1A is obtained.

Note that, in FIG. 1A, the structure composed of the color filter substrate 19, the colored layer (R) 20a, the colored layer (G) 20b, the colored layer (B) 20c, and the resin layer 21 is called a color filter.

Figure 1B:
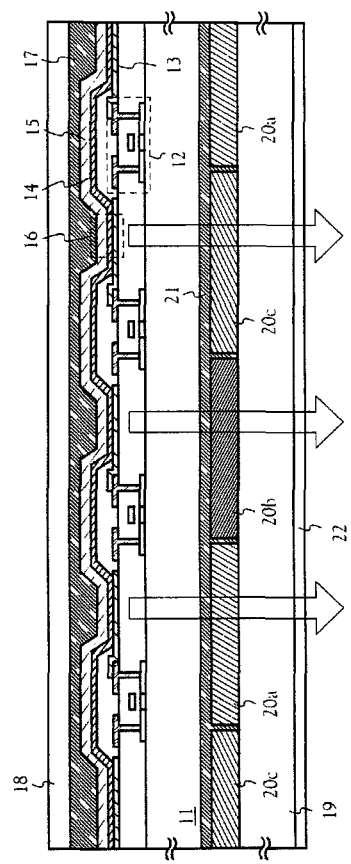

Also, FIG. 1B is an example that an antireflection film 22 is provided in the color filter, in addition to the state of FIG. 1A. The antireflection film 22 is a single layer or a lamination film having a condition in which reflection light is hardly occurred by controlling a refractive index and a film thickness, so a known antireflection film may be used. Instead of the antireflection film, a circular polarization plate (including a circular polarization film) may be provided.

The light emitting device described in this embodiment is characterized in that the active matrix substrate and the color filter are formed by the separate processes, and then both are stuck with each other after being completed. By taking such a structure, the yield of the active matrix substrate and the yield of the color filter can be individually controlled, thereby being capable of suppressing the lowering of the yield of the entire light emitting device.

Also, since a manufacturing process for forming the active matrix substrate and a manufacturing process for forming the color filter can be simultaneously run, the manufacturing period of the light emitting device can be shortened.

Embodiment 1

In this embodiment, the case where the present invention is applied to a passive matrix type (simple matrix type) EL light emitting device will be described. Note that reference numerals identical to those used in FIGS. 1A and 1B may be referred to the descriptions in embodiment mode.

Figure 2A:
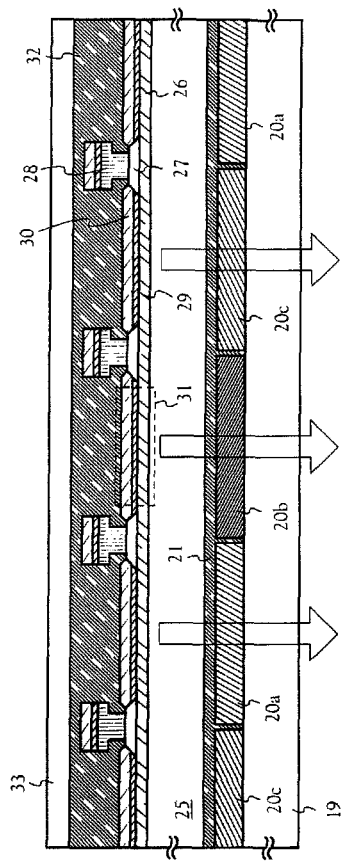
FIGS. 2A and 2B show cross sectional structures of the pixel portion of Embodiment 1.

In FIG. 2A, reference numeral 25 denotes a glass substrate, and reference numeral 26 is an anode made of an oxide conductive film. In this embodiment, a compound film made of indium oxide and tin oxide is used as the oxide conductive film. Note that, in the anode 26, plural rectangular electrodes in which a direction from the left to the right in the paper is a longitudinal direction, are provided along a depth direction in the paper.

Also, a first bank member 27 and a second bank member 28, which are made from an insulating film are provided on the anode 26. In this embodiment, a silicon oxide film is used as the first bank member 27, and a resin film is used as the second bank member 28. Employing a lamination structure consisting of two resin films, in which a lower layer is a higher etching rate than that of an upper layer as the second bank member 28, the structure as shown in FIG. 2A can be realized.

Both the first bank member 27 and the second bank member 28 are used as partitioning walls for rectangularly partitioning an EL layer 29 and a cathode 30 with insulation. Thus, the EL layer 29 and the cathode 30 become plural rectangular electrodes, which are provided so as to be orthogonal to the anode 26. Note that, in this embodiment, a hole injection layer is provided as the EL layer 29 on the anode 26, and a light emitting layer for emitting white color light is provided on the hole injection layer. Further, an alloy film in which lithium is added to aluminum is used as the cathode 30.

As described above, an EL element 31 composed of the anode 26, the EL layer 29, and the cathode 30, is provided on the front surface side of the substrate 25. In addition, the EL element 31 is protected by a sealing member 32 made of a resin curable with ultraviolet light and a covering member 33 made of glass, from water and oxygen in the outside. The substrate 25 after the cover member 33 is provided is called a passive matrix substrate in this specification.

Figure 2B:
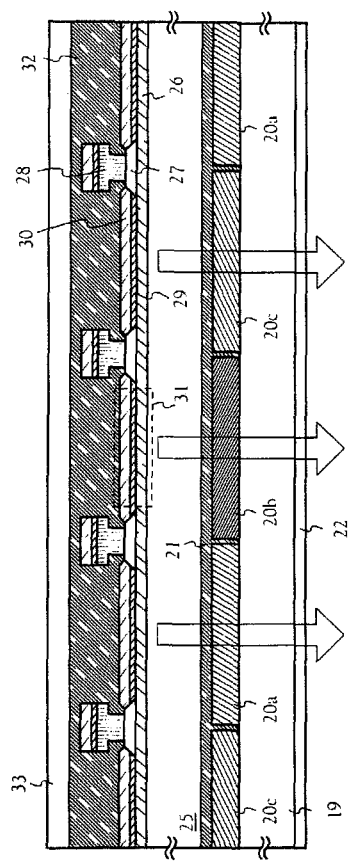

In this embodiment, the color filter described above (see FIG. 1A) is provided in the back surface side of the passive matrix substrate described hereinabove, with the result that the passive matrix type light emitting device as shown in FIG. 2A is obtained. Note that a black color pigment may be contained in a colored layer included in the color filter. Also, as shown in FIG. 2B, an antireflection film 22 or a polarization plate may be provided to the color filter.

In the light emitting device according to this embodiment, the passive matrix substrate and the color filter are formed by the separate processes, and then both are stuck with each other after being completed, with the result that the reduction in the yield of the entire light emitting device is suppressed. Also, since the passive matrix substrate and the color filter are simultaneously formed, the manufacturing period of the light emitting device may be shortened.

Embodiment 2

Figure 3A:
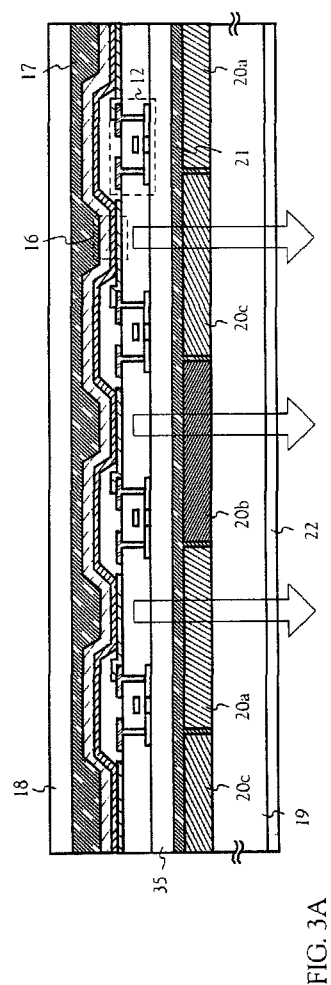
FIGS. 3A and 3B show cross sectional structures of the pixel portion of Embodiment 2.
Figure 3B:
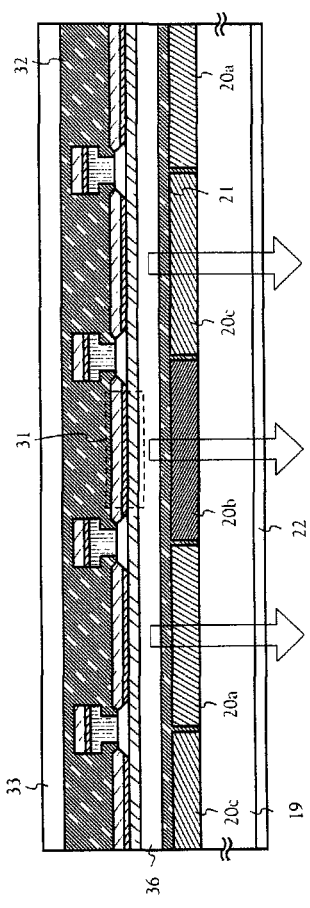

In the light emitting device as shown in FIGS. 1A and 1B or FIGS. 2A and 2B, after the active matrix substrate is completed, it is effective that the substrate on which an element has been formed is polished using a known CMP (chemical mechanical polishing) technique to make a thickness of the substrate thin. FIGS. 3A and 3B show a light emitting device according to this embodiment. Note that reference numerals identical to those used in FIGS. 1A and 1B or FIGS. 2A and 2B may be referred to the descriptions of embodiment mode.

In FIG. 3A, reference numeral 35 denotes a substrate polished by using the CMP technique, a structure except for this is similar to that of FIG. 1B. In this embodiment, a thickness of the substrate 35 is set as 300 µm or less (typically, 100 to 300 µm) by using the CMP technique. It is effective, for improving directivity of light, to make the thickness is set as a pixel pitch (distance from one pixel to next pixel) or less.

Also, FIG. 3B is an example that this embodiment is applied to an passive matrix type light emitting device. In this case, except that a substrate on which an EL element 31 has been formed is polished by the CMP technique to form a substrate 36, the structure of FIG. 3B is similar to that of FIG. 2B.

When this embodiment is implemented, in addition to the effect of the present invention, the light emitting device can be thinned and light-weighted by making the substrate on which the element has been formed, thin.

Embodiment 3

In this embodiment, a description will be made of an example of a light emitting device shown in FIGS. 1A and 1B or FIGS. 2A and 2B, in which a plastic film (a film formed of polymeric material) is used as a color filter substrate. A light emitting device of this embodiment is shown in FIGS. 4A and 4B. Note that reference numerals identical to those used in FIGS. 1A and 1B or FIGS. 2A and 2B may be referred to the descriptions of embodiment mode.

In FIG. 4A, a color filter film 40 is a film (plastic film) formed of a polymeric material, and protective films 41a and 41b are formed on both (front and back surfaces) surfaces thereof. Note that, in this embodiment, a plastic film is used, but a substrate made of hard plastic may be used.

Further, as protective films 41a and 41b, it is preferable that an insulating film is provided, which does not permeate water or oxygen or which hardly permeate water or oxygen. Typically, a carbon film, preferably a diamond like carbon (DLC) film is used. The DLC film may be formed within a temperature range of room temperature to 100° C. or less, and therefore the film may be easily formed as a low heat resistant plastic film. Further, in the case that the film is formed on a flexible plastic film, it may be formed by a roll-to-roll method.

Further, FIG. 4B is an example of applying this embodiment to a passive matrix light emitting device. In this case, except that the color filter made from the color filter film 40, provided with protective films 41a and 41b, is stuck with the substrate having the EL element 31 formed thereon, the other structure is the same as that in FIG. 2B.

In the case that this embodiment is implemented, in addition to the effect of this invention, the weight of the color filter is lightened so that the weight of the entire light emitting device may be reduced. Further, by using a plastic film with protective films on both sides as a cover material 18, a flexible light emitting device may be manufactured.

Embodiment 4

In this embodiment, a specific method of manufacturing a light-emitting device is described by referring to FIGS. 5A to 8. Here, a method of simultaneously manufacturing a pixel portion and a driver circuit TFT provided in the periphery thereof is explained. However, in order to simplify the explanation thereof, the CMOS circuit which is a basic unit of a driver circuit is shown in the figures.

Figure 5A:
FIGS. 5A to 5E show manufacturing processes of the pixel portion and a driver circuit of Embodiment 4.

First, as shown in FIG. 5A, a base film 302 is formed into a thickness of 300 nm on a glass substrate 301. In this embodiment, a silicon oxynitride film as the base film 302 is used as a laminated layer. At this time, the nitrogen concentration of the surface that contacts with the glass substrate 301 is preferably set as 1 to 25 wt %.

Further, it is effective for the base film 302 to have a heat releasing effect, and it is also effective to provide a carbon film, in particular a DLC (diamond like carbon) film on both sides or one side of the substrate 301. The DLC film may be formed by a CVD method or a sputtering method, and has an advantage in that the film may be formed at a temperature range of room temperature to 100° C. or less.

Next, an amorphous silicon film (not shown) with a thickness of 50 nm is formed by a known film formation method on the base film 302. Note that, the film is not necessary to be limited to an amorphous silicon film, a semiconductor film including an amorphous structure (including a micro crystalline semiconductor film) may be used. Further, it may be a compound semiconductor film such as an amorphous silicon germanium film. Besides, the film thickness may be 20 to 100 nm.

Then, an amorphous silicon film is crystallized by a technique disclosed in Japanese Patent Application Laid-open No. Hei 7-130652 to form a crystalline silicon film (polycrystalline silicon film or polysilicon film) 303. In this embodiment, nickel is used as an element for promoting crystallization. Of course, as another crystallizing method, a laser annealing crystallization method using a laser light and a lamp annealing crystallization method using an infrared light may be used.

Figure 5B:
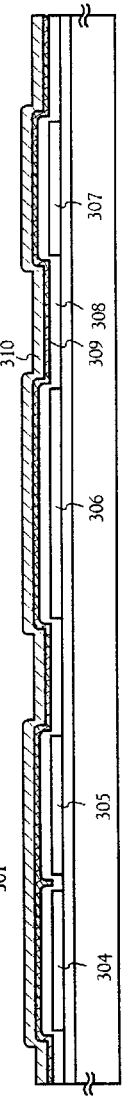

Next, as shown in FIG. 5B, the crystalline silicon film 303 is etched by a first photolithography process to form island-like semiconductor films 304 to 307. These semiconductor films are to become the active layers of the TFT later on.

In this embodiment, the protective films (not shown) made from a silicon oxide film are formed on the semiconductor films 304 to 307 into a thickness of 130 nm, and an impurity element (hereinbelow referred to as p-type impurity element), for forming a semiconductor of a p-type, is added to semiconductor films 304 to 307. As a p-type impurity element, an element belonging to Group 13 in the periodic table (typically boron or gallium) may be used. Note that, the protective film is provided so that the crystalline silicon film is not directly exposed to plasma and a delicate control of the concentration is enabled, when the impurity is added.

Further, the concentration of the p-type impurity element added at this time may be set as $1\times10^{15}$ to $5\times10^{17}$ atoms/cm$^3$ (typically, $1\times10^{16}$ to $1\times10^{17}$ atoms/cm$^3$). The p-type impurity element added at this concentration is used for the adjustment of the threshold voltage of the n-channel TFT.

Next, the gate insulating film 308 is formed so as to cover the semiconductor films 304 to 307. As the gate insulating film 308, an insulating film of a thickness of 10 to 200 nm, preferably 50 to 150 nm, including silicon may be used. This may be a single layer structure or a lamination structure. In this embodiment, a silicon nitride oxide film that is 115 nm thick may be used.

Next, as a first conductive film 309, a tantalum nitride film with a thickness of 30 nm is formed, and further as a second conductive film 310, a tungsten film with a thickness of 370 nm is formed. These metallic films may be formed by a sputtering method. Further, as a sputtering gas, inert gas such as Xe and Ne may be added to prevent the film from peeling off by the stress. Further, if the purity of the tungsten target is set to 99.9999%, a low resistant tungsten film may be formed with a resistivity of 20 mΩcm or less.

Next, resist masks 311a to 311g are formed to etch a first conductive film 309 and a second conductive film 310. Note that, in this specification, the etching process is referred to as a first etching process.

In this embodiment, an etching method using an ICP (inductively coupled plasma) is performed. As the etching gas, a mixed gas of carbon tetrafluoride ($CH_4$) and chlorine ($Cl_2$) is used, and the pressure for film formation is set as 1 Pa. In this state, an RF power (13.56 MHz) of 500 W is applied to a coil-type electrode to generate plasma. Further, an RF power (13.56 MHz) of 150 W is applied as a self biasing voltage to a stage on which the substrate is laid, to add a negative self bias to the substrate.

When etching is performed under these kinds of conditions, the selection ratio of tantalum nitride film and tungsten film becomes nearly 1:1, with the result that the etching may be performed all at once. Further, by making use of retreating of the resist masks 311a to 311e to form a taper shape having a taper angle of 15 to 45°. Under the etching condition of this embodiment, a taper angle of 25° may be obtained.

Thus, the gate electrodes 312 to 316 and a source wiring 317 and a drain wiring 318 of the switching TFT, which are formed from a lamination film consisting of the first conductive film and the second conductive film are formed. Note that, the drain wiring 318 also functions as a gate electrode of a current controlling TFT.

Figure 5C:
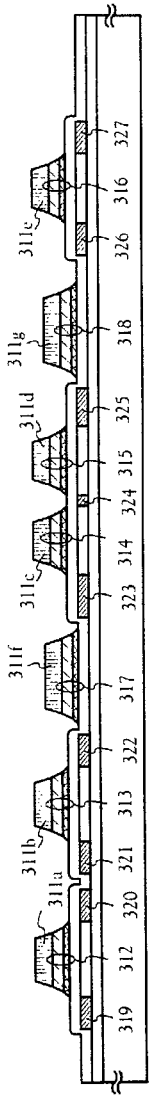

Next, using the gate electrodes 312 to 316, the source wiring 317 and the drain wiring 318 as masks, an n-type impurity element (phosphorus in this embodiment) is added in a self aligning manner. The impurity regions 319 to 327 thus formed contain the n-type impurity elements in the concentration range of $1\times10^{20}$ to $1\times10^{21}$ atoms/cm$^3$ (typically $2\times10^{20}$ to $5\times10^{21}$ atoms/cm$^3$). The first impurity regions 319 to 327 form source regions and drain regions of n-channel type TFT (FIG. 5C).

Figure 5D:
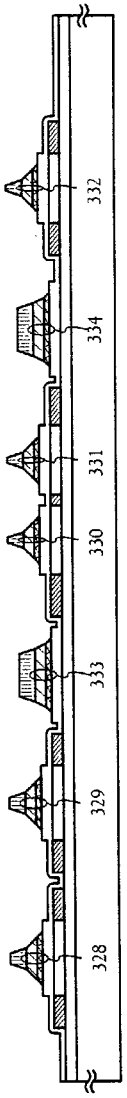

Next, etching of a gate electrode is carried out using the resist masks 311a to 311g as they are. The etching condition may be the same as the first etching process. In this case, the taper portion of the gate electrode is retreated, to form gate electrodes 328 to 332, source wirings 333 and the drain wiring 334, which have the narrower line widths than that of FIG. 5C (FIG. 5D).

Figure 5E:
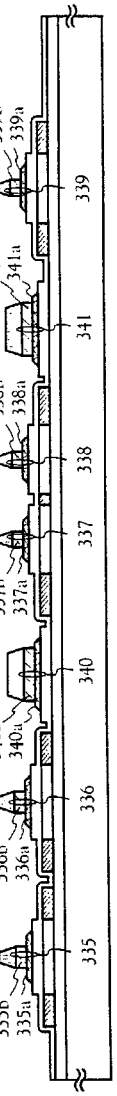

As shown in FIG. 5E, resist masks 311a to 311g are used as they are to selectively etch the second conductive film (tungsten film). As for the etching condition, the oxygen gas may be mixed as the etching gas to the first etching process, and in this specification, the etching process performed herein is referred to as a second etching process. This is because the progress of etching of the first conductive film (tantalum nitride film) becomes extremely slow when oxygen is added to the etching gas.

At this time, gate electrodes 335 to 339 having a lamination structure consisting of first gate electrodes 335a to 339a and second gate electrodes 335b to 339b, are formed. Further, a source wiring 340 having a lamination structure consisting of a first source wiring 340a and a second source wiring 340b and a drain wiring 341 having a lamination structure consisting of a first drain wiring 341a and a second drain wiring 341b are formed.

Figures 6A, 6B, 6C, 6D:
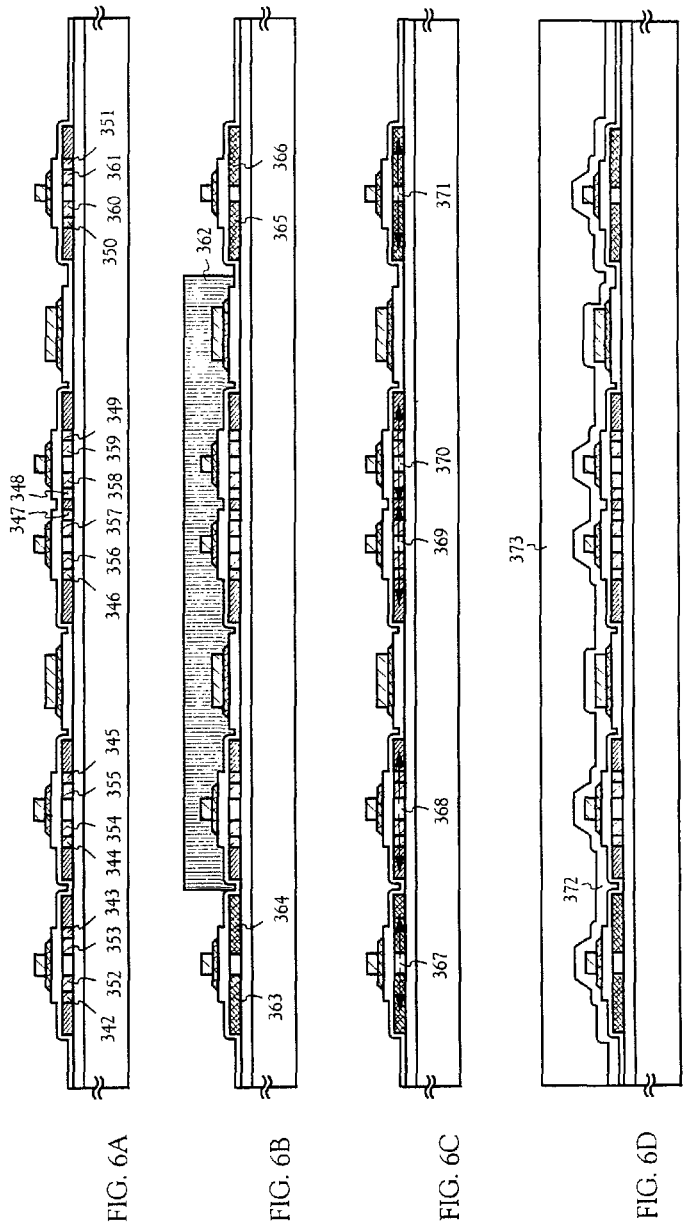
FIGS. 6A to 6D show manufacturing processes of the pixel portion and the driver circuit of Embodiment 4.

Next, resist masks 311a to 311g are removed, and as shown in FIG. 6A, are added with an n-type impurity element (in this embodiment phosphorus). In this process, the n-type impurity element is adjusted to be contained in n-type impurity regions 342 to 351 at a concentration of $2 \times 10^{16}$ to $5 \times 10^{19}$ atoms/cm$^3$ (typically $5 \times 10^{17}$ to $5 \times 10^{18}$ atoms/cm$^3$). Note that, in this specification, the impurity region into which the n-type impurity element is added at this concentration is referred to as an n-type impurity region (b).

Also, simultaneously n-type impurity regions 352 to 361 are formed. These impurity regions are formed by n-type impurity elements penetrating the first gate electrodes 335a to 339a, so phosphorus is added at a concentration ½ to ⅒ (typically ⅓ to ¼) of that of the n-type impurity regions 342 to 351. Specifically the n-type impurity elements are contained at a concentration of $1 \times 10^{16}$ to $5 \times 10^{18}$ atoms/cm$^3$ (typically, $3 \times 10^{17}$ to $3 \times 10^{18}$ atoms/cm$^3$). In this specification, the impurity region with an n-type impurity element added at this concentration is referred to as an n-type impurity region (c).

Since the n-type impurity element needs to be added through the first gate electrodes 335a to 339a and the gate insulating film 308, the acceleration voltage is set as high at 70 to 120 kV (in this embodiment 90 kV).

A resist mask 362 is then formed as shown in FIG. 6B. Then a p-type impurity element (in this embodiment boron) is added to form the impurity regions 363 to 366 including boron at a high concentration. In this case, boron is added by an ion doping method using diborane ($B_2H_6$) into a concentration of $3 \times 10^{20}$ to $3 \times 10^{21}$ atoms/cm$^3$ (typically $5 \times 10^{20}$ to $5 \times 10^{21}$ atoms/cm$^3$). The accelerating voltage may be set as 20 to 30 kV. Note that, in this specification, the impurity region added with p-type impurity element at this concentration is referred to as a p-type impurity region (a).

Note that, the p-type impurity regions (a) 363 to 366 include the region, which has already been added with phosphorus at a concentration of $1 \times 10^{20}$ to $1 \times 10^{21}$ atoms/cm$^3$, however the boron added here has a concentration of at least 3 times or more. Therefore, the n-type impurity region already formed is completely inverted to p-type, and functions as a p-type impurity region.

Next, after removing the resist mask 362, the n-type and p-type impurity elements added at respective concentrations are activated. Furnace annealing is performed as means of activation. Heat treatment is performed in this embodiment under a nitrogen atmosphere for 4 hours at 550° C. in an electric furnace. Note that it is desirable to make the oxygen concentration in the nitrogen atmosphere as low as possible at this point. This is to prevent the oxidization of the gate electrode, and it is preferable that the concentration of oxygen is set to desirably 1 ppm or less.

In this case, in the region to which the n-type impurity element is added, namely, regions including n-type impurity elements in an n-type impurity region or a p-type impurity region, nickel used for the crystallization of an amorphous silicon film is moved in the direction indicated by an arrow, and gettered. Namely the nickel concentration of the TFT channel formation regions 367 to 371 are largely reduced, and becomes at least $1 \times 10^{16}$ atoms/cm$^3$ or less (however, this value is a measurable minimum of secondary ion mass spectroscopy).

Further, as shown in FIG. 6D, a protective film 372 made of a silicon oxide film or a silicon nitride oxide film is formed. Thereafter, heat treatment is performed under a nitrogen atmosphere containing at a temperature of 300° C. to 450° C. to thereby perform hydrogenation. This process is one for terminating the dangling bonds in the semiconductor caused by thermally excited hydrogen. In this process hydrogen included in the protective film 372 diffuses to conduct hydrogenation. Plasma hydrogenation may be performed as another means of hydrogenation.

Further, it is possible to conduct hydrogenation in an atmosphere containing 3 to 100% hydrogen to perform heat treatment at a temperature of 300° C. to 450° C. for 1 to 12 hours.

When hydrogenation process is completed, a resin film with a film thickness of 1 to 2 μm is formed as the interlayer insulating film 373. As the resin material polyimide, polyamide, acryl resin or BCB (benzocyclobutene) may be used. Further, it is possible to use photosensitive resin.

Note that it is effective to perform plasma processing using $CF_4$ gas to the surface of the interlayer insulating film 373. By this process, the degree of adhesion of the wiring to be formed next may be increased.

Figures 7A, 7B:
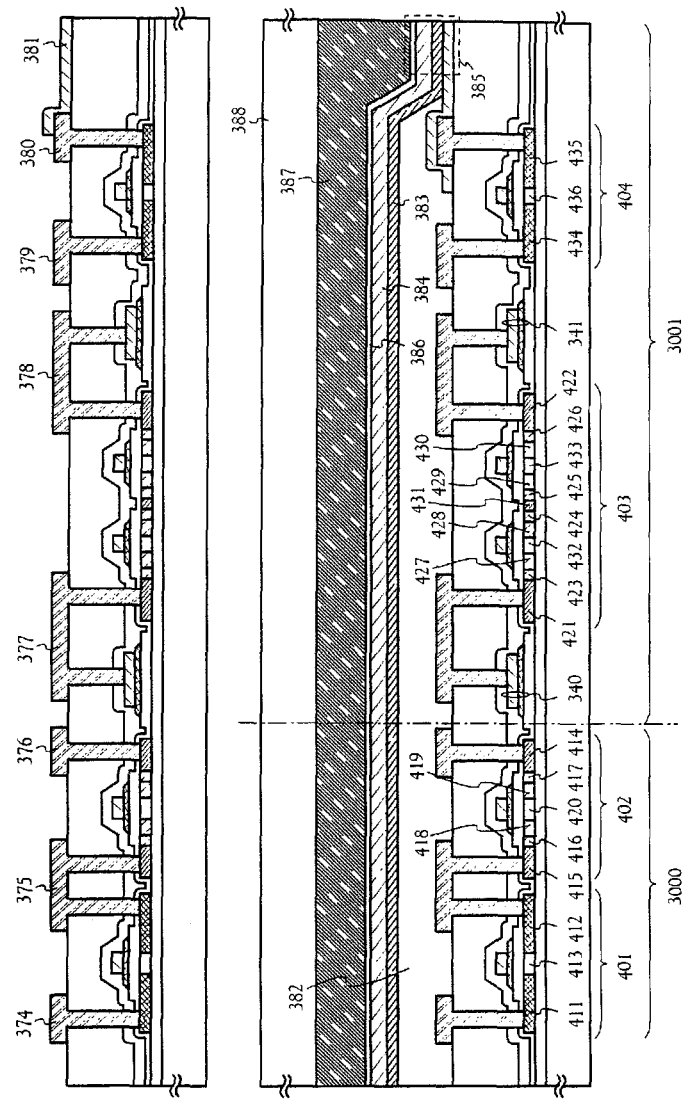
FIGS. 7A and 7B show manufacturing processes of the pixel portion and the driver circuit of Embodiment 4.

Next, as shown in FIG. 7A, a contact hole is formed in the interlayer insulating film 373 to thereby form wirings 374 to 380. It is to be noted that in this embodiment, this wiring is made of a lamination film composed of a three layer structure in which a Ti film having a thickness of 50 nm, an aluminum film containing Ti and having a thickness of 400 nm, and a Ti film having a thickness of 100 nm are formed in succession by sputtering. Of course, other conductive films may be used.

Here, wirings 374 and 376 functions as the source wiring of the CMOS circuit, and 375 functions as the drain wiring. The wiring 377 functions to electrically connect the source wiring 340 and the source region of the switching TFT, and the wiring 378 functions to electrically connect the drain wiring 341 and the drain region of the switching TFT.

Next, a pixel electrode 381 made of transparent oxide conductive films are formed in respect to a visible light. In this embodiment, an oxide conductive film with a zinc oxide added with oxide gallium is used as the pixel electrode 381, at a thickness of 120 nm. As the oxide conductive film, a conductive film made from indium oxide, zinc oxide, tin oxide, or a compound composed of these materials can be used.

A bank 382 is composed as shown in FIG. 7B. The bank 382 may be formed by patterning an insulating film including silicon or an organic resin film of 100 to 400 nm. The bank 382 is formed so as to fill the gap between the pixels (between the pixel electrodes). Further, it also has an object in that the organic EL material of a light emitting layer or the like to be formed next does not directly touch the end portion of the pixel electrode 381. In other words, it is an insulating film having an opening portion on a planar surface of the pixel electrode 383.

Note that, since the bank 382 is an insulating film, attention must be paid to the breakage of a device due to static electricity at the film formation. In this embodiment, the insulating film that is a material for the bank 382, is added with carbon particles or pigment to lower the resistivity to suppress the occurrence of static electricity. At this time, the added amount of carbon particles and pigment may be adjusted so that resistivity becomes $1 \times 10^6$ to $1 \times 10^{12}$ Ωm (preferably $1 \times 10^8$ to $1 \times 10^{10}$ Ωm).

Here, preprocessing is conducted to the surface of the pixel electrode 381. In this embodiment, the entire substrate is heated to 100 to 120° C., to form the oxygen plasma and conduct ultraviolet light irradiation. By this, an ozone plasma processing may be conducted to the surface of the anode. With this preprocessing the adsorbed oxygen and adsorbed water are removed from the surface of the anode 381, so that the work efficient on the surface is increased. Further, planarization of the surface of the anode is increased. The flatness of the surface of the anode is made so the roughness-mean-square value (Rms) of the surface becomes 5 nm or less (preferably 3 nm or less).

Note that, instead of the ozone plasma process, plasma processing using noble gas such as argon, neon or helium may be conducted.

Then, an EL layer 383 is formed by a spin coating method. Note that, in this embodiment, a lamination structure of a hole injection layer and a light emitting layer is referred to as an EL layer. That is, the EL layer is a laminate structure of a hole injection layer, a hole transportation layer, a hole preventing layer, an electron transportation layer, an electron injecting layer or an electron preventing layer. Note that, these may be organic or inorganic material or high molecular or low molecular.

In this embodiment, first a hole injection layer, is formed from polythiophene (PEDOT) to have a thickness of 20 nm, and the light emitting layer which further emits white light is formed from PVK (polyvinyl carbazole) to have a thickness of 80 nm. Polythiophene is applied in a form dissolved in water, and polyvinyl carbazole may be applied in a form dissolved in 1,2 dichloromethane. Further, heat processing is conducted in a temperature range (typically, 80 to 120° C.) which does not damage the EL layer after the hole injection layer and the light emitting layer are applied with the solvent, to obtain a thin film by volatilizing the solvent.

For example, 1,2 dichloromethane may be added with a dissolved forms of PVK, Bu-PBD (2-(4'-tert-butyl phenyl)-5-(4''-biphenyl)-1,3,4-oxazine azole), coumarin 6, DCM1 (4-dicyano methylene-2-methyl-6-p-dimethyl amino styryl-4H-pyran), TPB (tetra phenyl butadiene) and nile red.

Further as a high polymer material to be used as a light emitting layer which emits white light, the materials disclosed in Japanese Patent Application Laid-open No. Hei 8-96959 and Japanese Patent Application Laid-open No. Hei 9-63770 may be used.

Next after the EL layer 383 is formed, a cathode 384 formed of a conductive film with a small work function is formed with a thickness of 400 nm. In this embodiment, the cathode made of an alloy film constituting aluminum and lithium is formed by evaporation. In this way, the pixel electrode (anode) 381, the EL layer device 385 including the EL layer 383 and the cathode 384 is formed.

Note that, after the cathode 384 is formed, it is effective to form a passivation film 386 to cover completely the EL device 385. At this time, it is preferable to use as the passivation film 386 a film with good coverage, and a carbon film, particularly a DLC film is effective. The DLC film may be formed at a temperature of room temperature to 100° C. or less, so that it is easily formed on the EL layer 383 with low heat resistance. Further, it has a high blocking effect in respect to oxygen so that it may suppress oxidization of the EL layer 383 and the cathode 384.

Further, a sealing member 387 is provided on the passivation film 386 and cover members 388 are adhered together. As the sealing member 387, an ultraviolet hardened resin may be used and it is effective to provide a substance having a moisture absorption effect or a substance having an oxidation preventing effect. Further, the ultraviolet hardened resin may be used as an adhesive.

Further, as the cover material 388, a glass substrate, a metal substrate, a ceramic substrate and a plastic substrate (including a plastic film) may be used as the cover material 388. It is effective for both sides or one side of the cover material 388 to have a carbon film, particularly a DLC film. Note that, when using the plastic film as the cover material, the DLC film may be formed on both sides by a roll-to-roll method.

Thus, the state as shown in FIG. 7B is obtained. Note that, after the bank 382 is formed, it is effective to use a multi chamber type (or in line type) of forming device in the process until the passivation film 386 is formed and to continue processing without exposure to the atmosphere. However, when forming the EL layer by spin coating, it may be processed in a nitrogen atmosphere or a noble gas atmosphere conducted with a deoxygenation process.

Next, a glass substrate 390 is prepared for a color filter, and is formed with a colored layer (R) 391a, a colored layer (B) 391b and a colored layer (G) (not shown). At this time, the colored layer (R) 391a and the colored layer (B) 391b overlap in the portion indicated by 392. The overlapping portion 392 functions as a light shielding portion and is effective in making the outline between the pixels clear.

Figure 8:
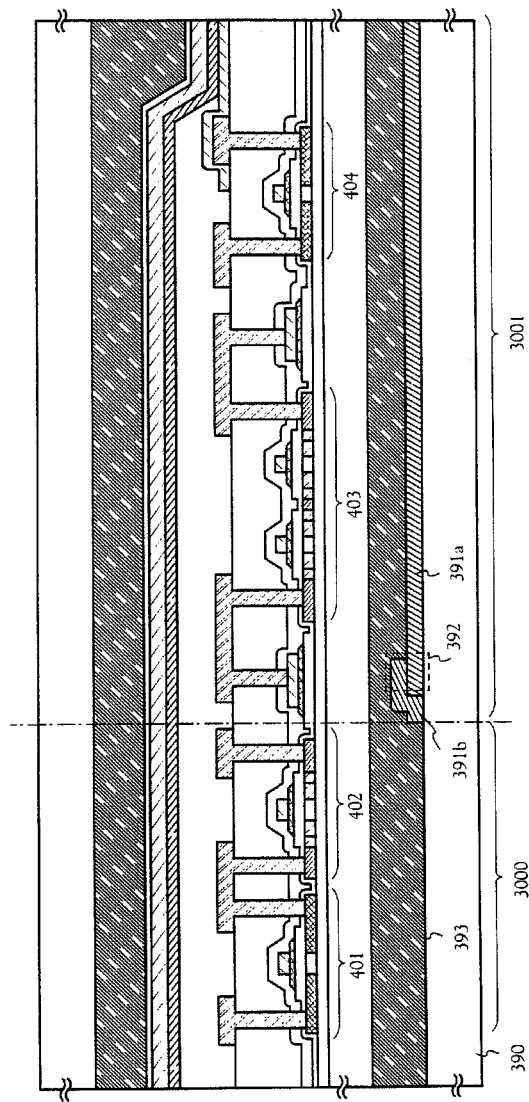
FIG. 8 shows a manufacturing process of the pixel portion and the driver circuit of Embodiment 4.

A resin layer 393 to level out a level difference caused by the colored layer (R) 391a, the colored layer (B) 391b and the colored layer (G) (not shown) is provided to form the color filter. Further, by using the resin layer 393, the color filter is adhered to the back side of the substrate 301. In this way, an EL light emitting device shown in FIG. 8 is completed.

Here, the respective TFTs will now be described. The driver circuit 3000 is formed with a CMOS circuit combining complementarily the p-channel TFT 401 and the n-channel TFT 402 as the basic unit. The driver circuit referred to here includes a shift register, a buffer, a level shifter, a latch, a sampling circuit (includes a transfer gate) and a D/A converter.

The active layer of a p-channel TFT 401 includes a source region 411, a drain region 412, and a channel forming region 413. Here, the source region 411 and the drain region 412 sandwich the gate insulating film 308 and overlap with the first gate electrode 335a.

The active layer of the n-channel TFT 402 contains the source region 414, the drain region 415, the n-channel impurity regions (b) 416, 417, the n-channel impurity regions (c) 418, 419, and the channel forming region 420. Here, the n-channel impurity regions (b) 416, 417 are provided to sandwich the gate insulating film 308 and so as not to overlap the first gate electrode 336a. The n-channel impurity regions (c) 418, 419, are provided to sandwich the gate insulating film 308 and so as to overlap the first gate electrode 336a. Note that, the n-channel impurity regions (c) 418, 419, provided to overlap the first gate electrode 336a has an effect of suppressing the hot carrier injection, and can effectively suppress the deterioration phenomenon due to the hot carrier injection.

Further, in the pixel portion 3001 are formed the switching TFT 403 and the current controlling TFT 404. Note that, the drain region of the switching TFT 403 is electrically connected to the gate electrode of the current controlling TFT 404, and the switch operation of the current controlling TFT 404 is controlled through the switching TFT 403. Then, the current amount flowing through the EL device from the current controlling TFT 404 is controlled.

The active layer of the switching TFT 403 contains the source region 421, the drain region 422, the n-type impurity regions (b) 423 to 426, the n-type impurity regions (c) 427 to 430, the separating region 431, the channel forming regions 432 and 433. Further, the source region 421 is connected to a source wiring 340 through a wiring 379. Furthermore, a drain region 422 is connected to a drain wiring 341 through a wiring 380. The drain wiring 341 is connected to a gate electrode 339 of the current controlling TFT 404.

The structure of the switching TFT 403 is the same as that of the n-channel TFT 402, and the n-channel impurity regions (b) 423 to 426 are provided to sandwich the gate insulating film 308 and so as not to overlap the first gate electrodes 337a and 338a, and the n-channel impurity regions (c) 427 to 430 are provided to sandwich the gate insulating film 308 and so as not to overlap the first gate electrode 337a, 338a. That is, the structure is effective against hot carrier degradation.

Note that, in this embodiment an example of an n-channel TFT as a switching TFT 403 is shown but it may be a p-channel TFT.

Also, the active layer of the current controlling TFT 404 contains the source region 434, the drain region 435, and the channel forming region 436. The structure of the current controlling TFT 404 is basically the same as that of the p-channel TFT 401 and the source region 434 and the drain region 435 sandwich the gate insulating film 308 so as to overlap the first gate electrode 339a. Note that, in this embodiment an example of an p-channel TFT used as a current controlling TFT 404 is shown but it may be an n-channel TFT.

Figure 9:
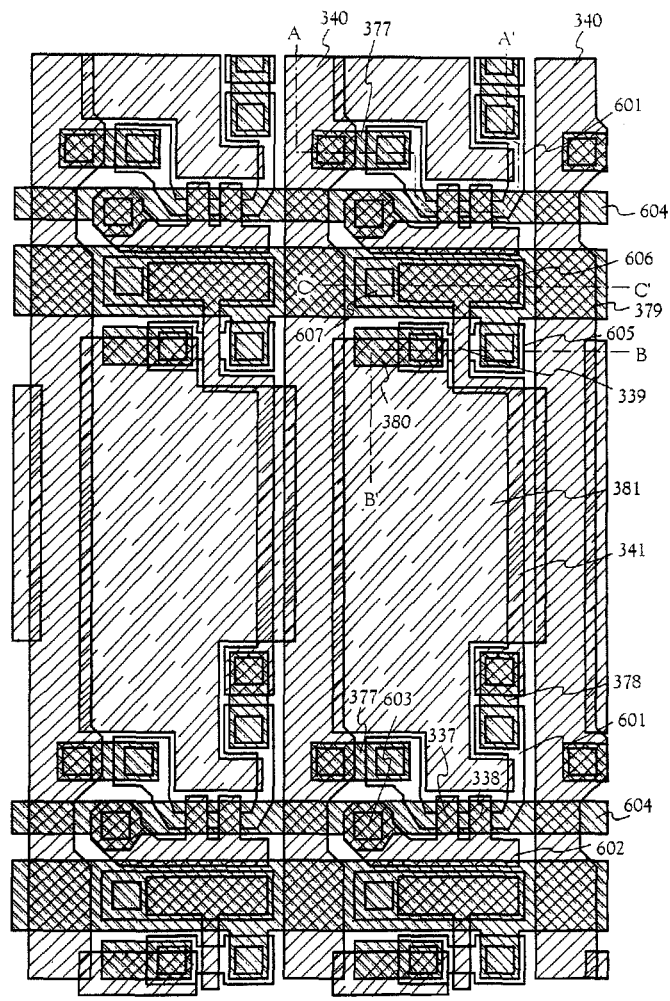
FIG. 9 shows a structure of the top surface of the pixel portion of Embodiment 4.
Figure 10:
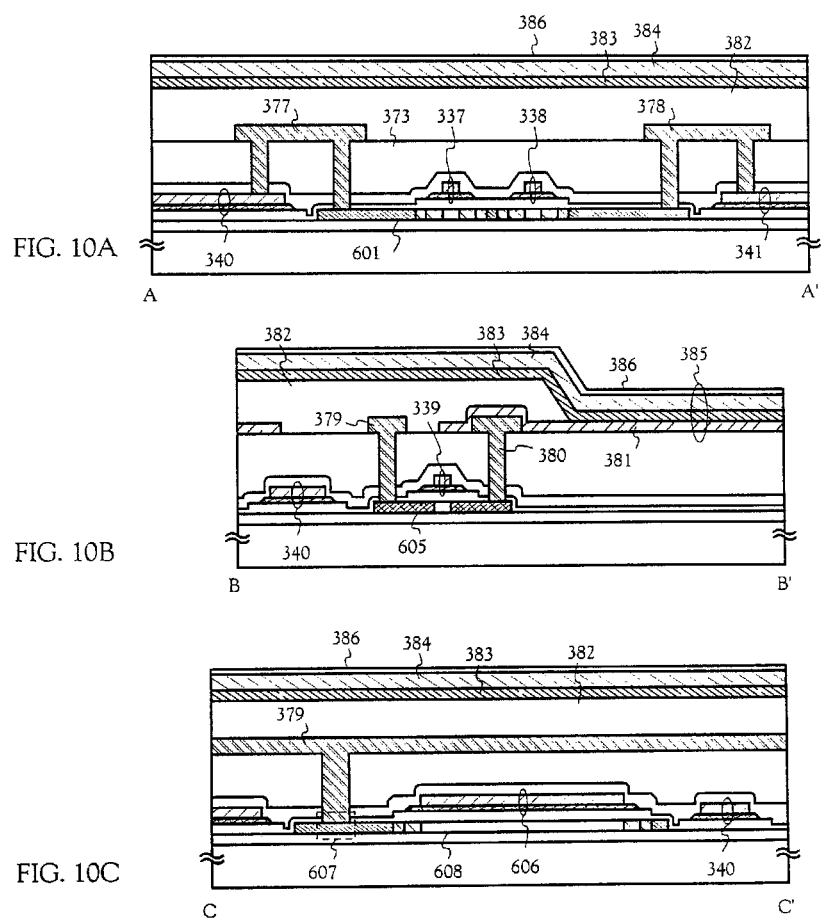
FIGS. 10A to 10C show cross sectional structures of the pixel portion of Embodiment 4.

Here, the top view of the pixel portion is shown in FIG. 9. Note that, FIG. 10A is a cross sectional diagram corresponding to FIG. 9 cut along the line A-A', FIG. 10B is a cross sectional diagram corresponding to FIG. 9 cut along the line B-B', FIG. 10C is a cross sectional diagram corresponding to FIG. 9 cut along the line C-C'. Note that, FIG. 10A shows a cross sectional structure of a switching TFT 403, FIG. 10B shows a cross sectional structure of a current controlling TFT 404 and FIG. 10C shows a cross sectional structure of a storage capacitor. The pixel portion shown here may be formed by the manufacturing processes shown in FIGS. 5A to 8, and the reference numerals used in FIGS. 5A to 8 may be referenced if necessary.

The switching TFT 403 is first described using FIGS. 9 and 10A. In FIGS. 9 and 10A, reference numeral 601 denotes an active layer. Details of the active layer 601 is as described referring to FIG. 7B, therefore the detailed description is omitted here. The source wiring 340 is electrically connected to the active layer 601 through the wiring 377, and further is electrically connected to the drain wiring 341 through the wiring 378.

On the active layer 601 is provided a gate electrode 602. Further, from the gate electrode 602, the portion which overlaps with the active layer 601 corresponds to the gate electrode 337 and 338 of FIG. 5E. Further, the gate electrode 602 is electrically connected to the gate wiring 604 in the contact portion 603.

Next, the current controlling TFT 404 is described using FIGS. 9 and 10B. In FIGS. 9 and 10B, reference numeral 605 denotes an active layer. Details of the active layer 605 is as described in FIG. 7B, therefore detailed description is omitted here. The source region of the active layer 605 is electrically connected to the wiring (current supply line) 379 and the drain region is electrically connected to the pixel electrode (an anode of the EL device) 381.

The gate electrode 339 is provided on the active layer 605. The gate electrode 339 corresponds to the portion where the drain wiring 341 overlaps the active layer 605. Further, the drain wiring 341 extends so as to function also as the upper electrode 606 of the storage capacitor shown in FIG. 10C. The wiring (current supply line) 379 is electrically connected to the semiconductor film 608 at the contact portion 607, and the semiconductor film 608 functions as a lower electrode of the storage capacitor.

Figure 11:
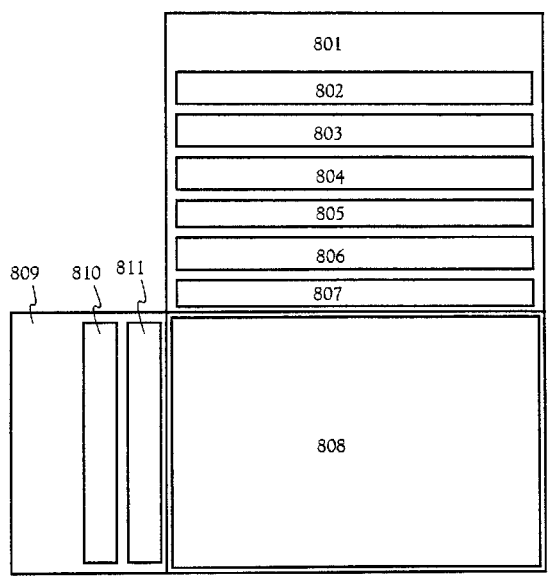
FIG. 11 shows a circuit configuration of an EL light emitting device of Embodiment 4.

An example of a circuit structure of the EL light emitting device of this embodiment is shown in FIG. 11. Note that, a circuit structure for conducting a digital drive is shown in this embodiment. In this embodiment, the circuit structure comprises a source side driver circuit 801, a pixel portion 808 and a gate side driver circuit 809. Note that, in this application, the driver circuit portion is a generic term including a source side driver circuit and a gate side driver circuit.

In this embodiment, an n-channel TFT with a structure as shown in FIG. 7B is provided as a switching TFT in the pixel portion 808. The switching TFT is arranged at an intersection of a gate wiring connected to a gate side driver circuit 809 and a source wiring connected to a source side driver circuit 801. Further, the drain region of the switching TFT is electrically connected to the gate electrode of the p-channel current controlling TFT.

The source side driver circuit 801 is provided with a shift register 802, a buffer 803, a latch (A) 804, a buffer 805, a latch (B) 806 and a buffer 807. Further, in an analog drive, a sampling circuit (transfer gate) may be provided instead of the latches (A) and (B). Note that, the gate side driver circuit 809 is provided with a to shift register 810 and a buffer 811.

Note that, although not shown, it is possible to further provide a gate side driver circuit on the opposite side of the gate side driver circuit 809 sandwiching the pixel portion 808. In this case, both have the same structure and a common gate wiring, and is a structure in which even if one is damaged, the other can send a gate signal to operate normally the pixel portion.

The above structure may be easily realized by manufacturing TFTs according to the manufacturing steps shown in FIGS. 5A to 7. Further, in this embodiment, although only the structure of the pixel portion and the driver circuit portion is shown, it is possible to form a logical circuit other than the driver circuit, such as a signal dividing circuit, a D/A converter circuit, an operational amplifier circuit, or a γ-correction circuit, on the same substrate if the manufacturing steps of the circuits are carried out in accordance with those of this embodiment. In addition, it is considered that a memory, a microprocessor, or the like can be formed on the same substrate.

Further, an EL light emitting device of this embodiment which has conducted the steps until the end of a sealing (filling) process to thereby protect the EL element is described using FIGS. 12A and 12B. Note that, reference numerals used in FIG. 11 may be cited if necessary.

FIG. 12A is a top surface view showing a state where steps up to the sealing of the EL element have been conducted. Reference numeral 801 shown by dotted lines denotes a source side driver circuit, reference numeral 808 denotes a pixel portion, reference numeral 809 denotes a gate side driver circuit. Further, reference numeral 901 denotes a cover material, reference numeral 902 denotes a first sealing material, reference numeral 903 denotes a second sealing material. Between the inner cover material 901 surrounded by the first sealing material 902 and the substrate formed with an EL element is provided a sealing material (not shown).

Note that, reference numeral 904 is a connection wiring for transmitting the signal inputted to the source side driver circuit 801 and the gate side driver circuit 809, and for receiving a video signal or a clock signal from the FPC 905 to be an external input terminal.

Here, FIG. 12B shows a cross sectional diagram corresponding to FIG. 12A cut along the line A-A'. Note that, in FIGS. 12A and 12B, for the same portions the same reference numerals are used.

As shown in FIG. 12B, the pixel portion 808 and the gate side driver circuit 809 are formed on the glass substrate 906. The pixel portion 808 is composed of a plurality of pixels each including the current controlling TFT 404 and the pixel electrode 381 that is electrically connected to the current controlling TFT 404 and the drain region thereof. The gate side driver circuit 809 is formed using a CMOS circuit in which the n-channel TFT 401 and the p-channel TFT 402 are combined complementarily.

The pixel electrode 381 functions as an anode of an EL element. Further, both ends of the pixel electrode 381 are formed with banks 382, and an EL layer 383 and a cathode 384 of an EL device are formed on the pixel electrode 381. The cathode 384 functions as a common wiring for all pixels and is electrically connected to the FPC 905 via the connection wiring 904. Further, the element included in the pixel portion 808 and the gate side driver circuit 809 are all covered by the cathode 384.

Further, cover materials 901 are adhered together by a first sealing material 902. At this time, a spacer made of a resin film may be provided to ensure a gap between the cover material 901 and the EL element. Then, the inner side of the first sealing material 902 is filled with a sealing material 907. Note that, as the first sealing material 902 and the sealing material 907, it is preferred to used a light hardened resin. Note that, it is preferable that the first sealing material 902 is a material that does not transmit moisture or oxygen as much as possible. Further, a substance having an adsorption effect or a substance having an oxidizing prevention effect may be contained inside the sealing material 907.

The sealing material 907 provided to cover the EL element also functions as an adhesive to adhere the cover material 901. As the sealing material 907, a polyimide, an acryl, a PVC (polyvinyl chloride), an epoxy resin, a silicone resin, a PVB (polyvinyl butyral) or a EVA (ethylene-vinyl acetate) may be used.

Further, in this embodiment as the cover material 901, a glass plate, a quartz plate, a plastic plate, a ceramic plate, an FRP (Fiberglass-Reinforced Plastics) plate, a PVF (polyvinyl fluoride) film, a myler film, a polyester film, an acryl film or the like may be used.

Further, in this embodiment, on both surfaces of the cover material 901 are provided carbon films (specifically a DLC film) 908a, 908b at a thickness of 2 to 30 nm. This kind of carbon film has a role of preventing oxygen and water from penetrating as well as protecting mechanically the surface of the cover material 901. Of course, a polarizing plate (typically a circular polarizing plate) may be adhered to the outer side of the carbon film 908a.

Further, after a cover material 901 is adhered using the sealing material 907, the second sealing material 903 is provided to cover the side surface (exposed surface) of the sealing material 907. The second sealing material 903 may use the same material as the first sealing material 902.

By filling the EL element into the sealing material 907 with the above structure, the EL element may be completely shielded from the outside, and the penetration of a substance which facilitates deterioration of an EL layer by oxidation due to such as moisture and oxygen from the outside may be prevented. Therefore, an EL light emitting device with high reliability may be manufactured.

Embodiment 5

Figure 14:
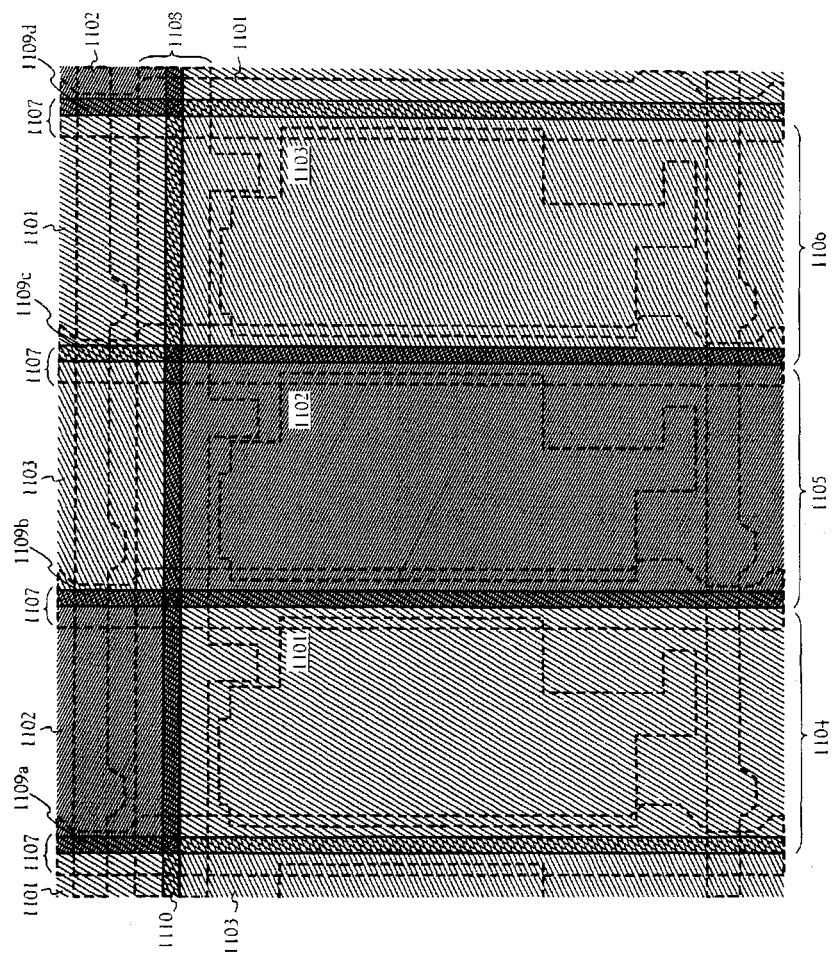
FIG. 14 shows a structure of the top surface of the pixel portion of Embodiment 5.

In this embodiment, FIG. 14 is used to describe the example of the arrangement of the colored layers. FIG. 14 shows a top view of the pixel portion and the structure of each pixel is the same as that described using FIGS. 9, and 10A to 10C.

In FIG. 14, reference numeral 1101 denotes a colored layer (R), reference numeral 1102 denotes a colored layer (G) and reference numeral 1103 denotes a colored layer (B). Further, reference numeral 1104 denotes a pixel that emits red light, reference numeral 1105 denotes a pixel that emits green light, reference numeral 1106 denotes a pixel that emits blue light. In this embodiment, the pixel 1106 that emits blue light is provided with a colored layer (B) 1103, the pixel 1104 that emits red light is provided with a colored layer (R) 1101, and the pixel 1105 that emits green light is provided with a colored layer (G) 1102.

The colored layer (R) 1101, the colored layer (G) 1102 and the colored layer (B) 1103 overlap with each other above the source wiring 1107 and the current supply line 1108 to form light shielding portions 1109a to 1109d and 1110. In this way, each pixel is a structure such that the pixels are surrounded by the light shielding portions 1109a to 1109d and 1110. Of the light generated in each pixel, the light which reaches the light shielding portions 1109a to 1109d and 1110 is absorbed. Namely, color mixing in between the adjacent pixels may be effectively suppressed.

Note that, it is effective to include in each colored layer, a black pigment or carbon particles. In this way, light from the outside is absorbed, so that the problem of the person observing the image reflecting in the cathode made from a metal film is reduced. However, if the contained amount is too large the light emitting amount decreases, therefore the desirable adding amount is 1 to 10%.

Note that, this embodiment may be combined with the EL light emitting device described in the preferred embodiments of the present invention or may be combined freely with any of the structures of Embodiments 1 to 4.

Embodiment 6

In the embodiment modes of the present invention and Embodiment 4, an example of using an EL material in which a white light emission is obtained as a light emitting layer contained in the EL layer, and passing the white light irradiated from thereof through the colored layer (R), the colored layer (G) or the colored layer (B) to thereby obtain a red light, a green light or a blue light.

In this embodiment, on a pixel which emits red light is formed a light emitting layer which can obtain a red light emission, on a pixel which emits green light is formed a light emitting layer which can obtain a green light emission, and on a pixel which emits blue light is formed a light emitting layer which can obtain a blue light emission. Then, a red light, a green light or a blue light irradiating from each light emitting layer is passed through respectively the colored layer (R), the colored layer (G) or the colored layer (B) to improve the color purity.

In this embodiment, it is necessary to form a film from three kinds of EL materials that can obtain a red, green or blue light emission, and a known material may be used. Further, since it is necessary to form a film separately for each pixel, a film formation from low molecular EL material by deposition using a shadow mask or film formation from high molecular EL material by an ink jet method or a printing method may be performed.

Note that, the structure of this embodiment may be implemented by freely combining any of the structures of the embodiment modes of this invention and Embodiments 1 to 5.

Further, as shown in Embodiment 5, it is effective to include a black pigment or a carbon particle in each colored layer.

Embodiment 7

This embodiment shows an example of using an EL material, which can obtain light emission of a blue or blue-green color, as a light emitting layer and passing the light emitted through the light converting layer to obtain a red light, a green light or a blue light.

In this embodiment, a color converting layer for converting a blue light into a red light is formed in the pixel emitting red light, and a color converting layer for converting blue light into a green light is formed in the pixel that emits green light. A known color converting layer may be used. The blue light irradiated from the light emitting layer excited the color converting layer to generate a red or green light.

Then, by passing the red light from the converter layers of each color, the green light, and the blue light irradiated from the light emitting layer through to the colored layer (R), the colored layer (G) and the colored layer (B), the color purity is improved.

In this embodiment, since only the light emitting layer which can obtain light emission of a blue and blue-green light need to be formed, it is preferable to use a convenient technique such as a spin coating method or a printing method. Of course, an evaporation method may be conducted.

Note that, the structure of this embodiment may be implemented by freely combining any of the embodiment modes of the invention, Embodiments 1 to 5. Further, as described in Embodiment 5, it is effective to include in each colored layer a black pigment or carbon particles.

Embodiment 8

In this embodiment an EL light emitting device having a pixel portion with a structure different to that of Embodiment 4 is shown. Note that, aside from the layer on which each kind of wiring (such as the gate wiring, the source wiring, the drain wiring or the current supply wiring) is formed differ, the TFT structure and the EL element structure are substantially the same as Embodiment 4. Therefore, for the same portions as in Embodiment 4, the reference numerals used in FIGS. 9 and 10A to 10C are cited.

Figure 15:
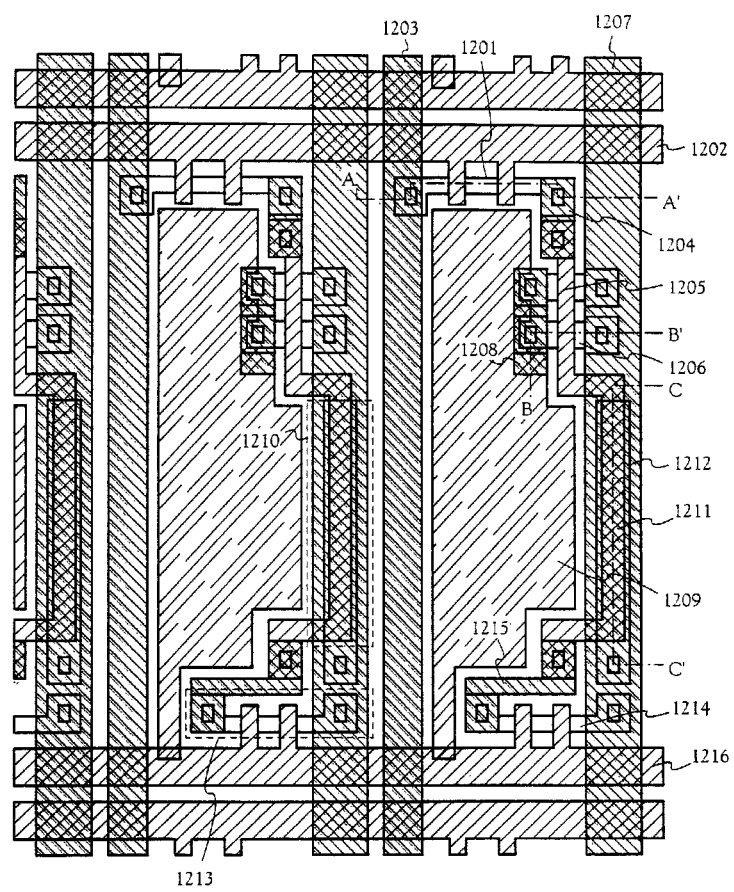
FIG. 15 shows a structure of the top surface of the pixel portion of Embodiment 8.
Figure 16A:
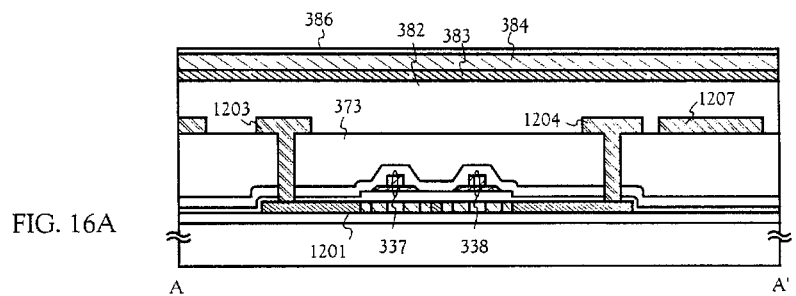
FIGS. 16A to 16C show cross sectional structures of the pixel portion of Embodiment 8.
Figure 16B:
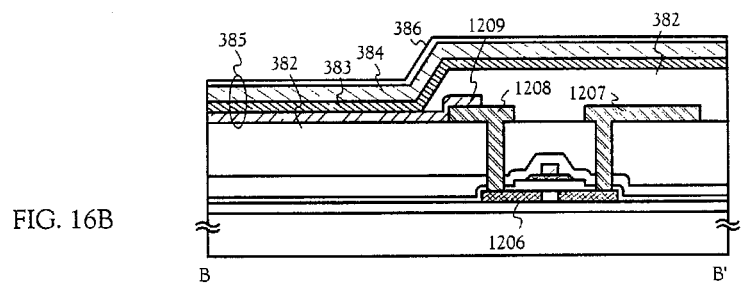
Figure 16C:
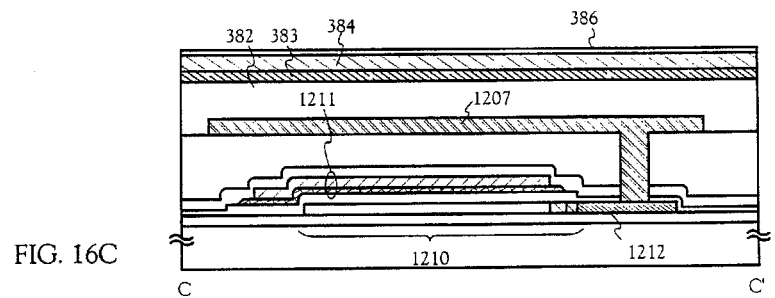

Here, a top view of the pixel portion is shown in FIG. 15. Further, in FIG. 16A is a cross sectional diagram corresponding to FIG. 15 cut along the line A-A', FIG. 16B is a cross sectional diagram corresponding to FIG. 15 cut along the line B-B', and FIG. 16C is a cross sectional diagram corresponding to FIG. 15 cut along the line C-C'. Note that, FIG. 16A shows a cross sectional structure of a switching TFT, FIG. 16B shows a cross sectional structure of a current controlling TFT and FIG. 16C shows a cross sectional structure of a storage capacitor. The pixel portion shown here may be formed by the referring to the manufacturing processes shown in FIGS. 5A to 7B.

First, the switching TFT is described by using FIGS. 15 and 16A. In FIGS. 15 and 16A, reference numeral 1201 denotes an active layer. The details of the active layer 1201 is the same as the switching TFT described in FIG. 7B, therefore the description thereof is omitted here. The gate wiring 1202 overlaps the active layer 1202 to thereby function as a gate electrode. Then, the active layer 1201 is connected with the source wiring 1203 and the drain wiring 1204, and the drain wiring 1203 is connected to the gate wiring 1205 of the current controlling TFT.

Next, the current control TFT is explained with reference to FIG. 15 and FIG. 16B. Note that the current control TFT has the structure in which two TFTs are connected in parallel. Here, one of the TFTs is explained. In FIG. 15 and FIG. 16B, reference numeral 1206 denotes an active layer. The details of the active layer 1206 is not explained here since the active layer 1206 is similar to the current control TFT explained in FIG. 7B. A source region of the active layer 1206 is connected to a current supply line 1207, and a drain region is electrically connected to a pixel electrode (an anode of an EL element) 1209 through a drain wiring 1208.

Further, the gate wiring 1205 of the current control TFT also serves as an upper electrode 1211 of a storage capacitor 1210 shown in FIG. 16C right under the current supply line 1207. At this point, the current supply line 1207 is electrically connected to a semiconductor film 1212, and this semiconductor film 1212 functions as a lower electrode of the storage capacitor 1210. In accordance with the structure in this embodiment, the storage capacitor 1210 is completely hidden under the current supply line 1207. Thus, the effective light emission area of the pixel is not reduced.

Next, the erasure TFT is described. The pixels of this embodiment are provided with a erasure TFT 1213 with the same structure as the switching TFT. In the active layer 1214 of the erasure TFT 1213, the source region is electrically connected to the current supply line 1207, and the drain region is connected to the gate wiring 1205 of the current control TFT through the drain wiring 1215. Note that, the structure of the active layer 1214 is the same as that of the switching TFT, therefore description thereof is omitted here.

Note that, the gate wiring (hereinbelow referred to as erasure gate wiring) 1216 of the erasure TFT is provided in parallel to the gate wiring 1202 of the switching TFT.

When a signal which turns on the erasure TFT 1213 enters the erasure gate wiring 1216, the gate wiring 1205 of the current control TFT forcibly has the same potential as the current supply line 1207. That is, since the current control TFT is turned off, the current supply to the EL element 385 is stopped. Thus, the light emission stops and the pixel is turned off.

As described above, the pixel can be forcibly turned off by providing the erasure TFT 1213, and the controllability of the turn-on period of the pixel is enhanced. That is, the number of gradations can be easily increased in the image display of a time gradation method. Note that Japanese Patent Application Serial No. Hei 11-338786 may be cited as to the EL light emitting device using the erasure TFT.

Note that, the structure of this embodiment may be implemented by combining freely with any of the structures of the embodiment modes of the invention, Embodiment 2, Embodiment 3, or Embodiments 5 to 7.

Embodiment 9

In this embodiment, an example of manufacturing an EL light emitting device by the manufacturing process different from that in Embodiment 4 is explained with reference to FIGS. 17A to 17D. Note that since this embodiment is different from Embodiment 4 only in the intermediate process, reference symbols in Embodiment 4 are referred as the need arises.

First, the process is conducted through the step of FIG. 5E in accordance with the manufacturing process in Embodiment 4. However, the addition process of an n-type impurity element shown in FIG. 5C is omitted in this embodiment. Thus, the state in FIG. 17A is obtained.

Next, as shown in FIG. 17B, after the resist masks 311a to 311e are removed, an n-type impurity element (phosphorous in this embodiment) is added to a semiconductor film. Note that an addition process of an n-type impurity element here may be performed with the same condition as the addition process shown in FIG. 6A in Embodiment 1.

In this manner, the n-type impurity regions (b) 501 to 509 and the n-type impurity regions (c) 510 to 519 are formed. Note that Embodiment 4 may be referred as to the concentration of the n-type impurity element contained in the n-type impurity regions (b) 501 to 509 and the n-type impurity regions (c) 510 to 519.

Next, the resist masks 520a to 520e are formed, and an n-type impurity element (phosphorous in this embodiment) is added as in the addition process shown in FIG. 5C in Embodiment 4. Thus, the n-type impurity regions (a) 521 to 529 are formed. Note that Embodiment 4 may be referred as to the concentration of the n-type impurity element contained in the n-type impurity regions (a) 521 to 529. (FIG. 17C)

At this point, the portion of the n-type impurity regions (b) 501 to 509, which is covered by the resist masks 520a to 520e, functions as an LDD (light dope drain) region later. In this embodiment, the length (LDD length) of the n-type impurity regions (b), which function as the LDD region later, can be freely controlled by the resist masks 520a to 520e. Thus, this embodiment has a feature of the excellent controllability of the LDD length.

Next, the resist masks 520a to 520e are removed, and the resist mask 530 is formed. Then, a p-type impurity element (boron in this embodiment) is added as in the addition process shown in FIG. 6B in Embodiment 1. Thus, the p-type impurity regions (a) 531 to 534 are formed. Note that Embodiment 1 may be referred as to the concentration of the p-type impurity element contained in the p-type impurity regions (a) 531 to 534. (FIG. 17D)

Thereafter, the EL light emitting device may be manufactured in accordance with the steps after the activation process shown in FIG. 6C in Embodiment 4. Further, the completed TFT structure is almost the same as that in Embodiment 4, and therefore, the explanation in Embodiment 4 may be referred. Note that it is possible to implement this embodiment by freely combining it with any of the embodiment modes and Embodiments 2 to 8.

Embodiment 10

In this embodiment, an example of manufacturing an EL light emitting device by a manufacturing process different from that in Embodiment 4 is explained with reference to FIGS. 18A to 18D. Note that since this embodiment is different from Embodiment 4 only in the intermediate process, reference symbols in Embodiment 4 are referred as the need arises.

First, the process is conducted through the step of FIG. 5E in accordance with the manufacturing process in Embodiment 4. However, the addition process of an n-type impurity element shown in FIG. 5C is omitted in this embodiment. Thus, the state in FIG. 18A is obtained.

Next, as shown in FIG. 18B, after the resist masks 311a to 311e are removed, an n-type impurity element (phosphorous in this embodiment) is added. Note that an addition process of an n-type impurity element here may be performed with the same condition as the addition process shown in FIG. 6A in Embodiment 4.

In this manner, the n-type impurity regions (b) 501 to 509 and the n-type impurity regions (c) 510 to 519 are formed. Note that Embodiment 4 may be referred as to the concentration of the n-type impurity element contained in the n-type impurity regions (b) 501 to 509 and the n-type impurity regions (c) 510 to 519.

Then, an n-type impurity element (phosphorous in this embodiment) is added to a semiconductor film as in the addition process shown in FIG. 5C in Embodiment 4 using the gate electrodes 335 to 339 as masks. Thus, n-type impurity regions (a) 541 to 549 are formed. Note that Embodiment 4 may be referred as to the concentration of the n-type impurity element contained in the n-type impurity regions (a) 541 to 549. (FIG. 18C)

Next, a resist mask 550 is formed, and a p-type impurity element (boron in this embodiment) is added as in the addition process shown in FIG. 6B in Embodiment 4. Thus, p-type impurity regions (a) 551 to 554 are formed. Note that Embodiment 4 may be referred as to the concentration of the p-type impurity element contained in the p-type impurity regions (a) 551 to 554. (FIG. 18D)

Thereafter, the EL light emitting device may be manufactured in accordance with the steps after the activation process shown in FIG. 6C in Embodiment 4. Further, the completed TFT structure is almost the same as that in Embodiment 4, and therefore, the explanation in Embodiment 4 may be referred. Note that it is possible to implement this embodiment by freely combining it with any of the embodiment modes and Embodiments 2 to 8.

Embodiment 11

A resin film is used as the interlayer insulating film 373 in Embodiment 4, but in this embodiment, an insulating film containing silicon, more specifically, a silicon oxide film is used. In this embodiment, after the process through the step of FIG. 6B is finished, a protective film (an silicon nitride oxide film in this embodiment) with a thickness of 100 to 200 nm is formed so as to cover gate electrodes.

Next, an activation process as in FIG. 6C is performed, and an interlayer insulating film (a silicon oxide film in this embodiment) with a thickness of 800 nm to 1 μm is disposed. In this embodiment, before this interlayer insulating film is formed, a heat treatment is conducted in an atmosphere containing 3 to 100% hydrogen at 350 to 500° C. Then, dangling bonds of an active layer are terminated by thermally excited hydrogen.

Thereafter, a source wiring or a drain wiring is formed on the interlayer insulating film and the wiring is covered by a passivation film. In this embodiment, a silicon nitride film or a silicon nitride oxide film is used as the passivation film.

Note that it is possible to implement this embodiment by freely combining it with any of the embodiment modes and Embodiments 2 to 10.

Embodiment 12

Figure 13A:
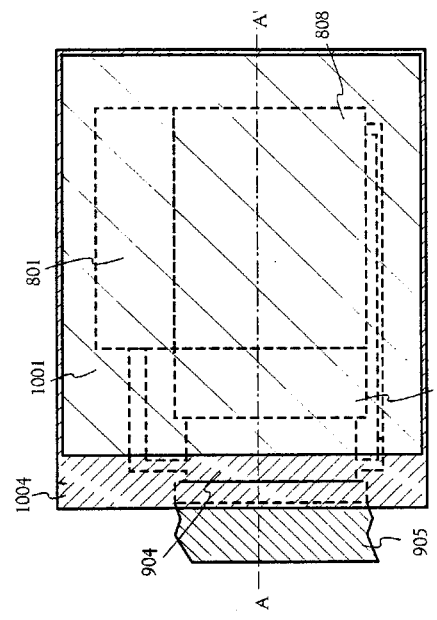
FIGS. 13A and 13B show a structure of the top surface and a cross sectional structure of the EL light emitting device of Embodiment 12.
Figure 13B:
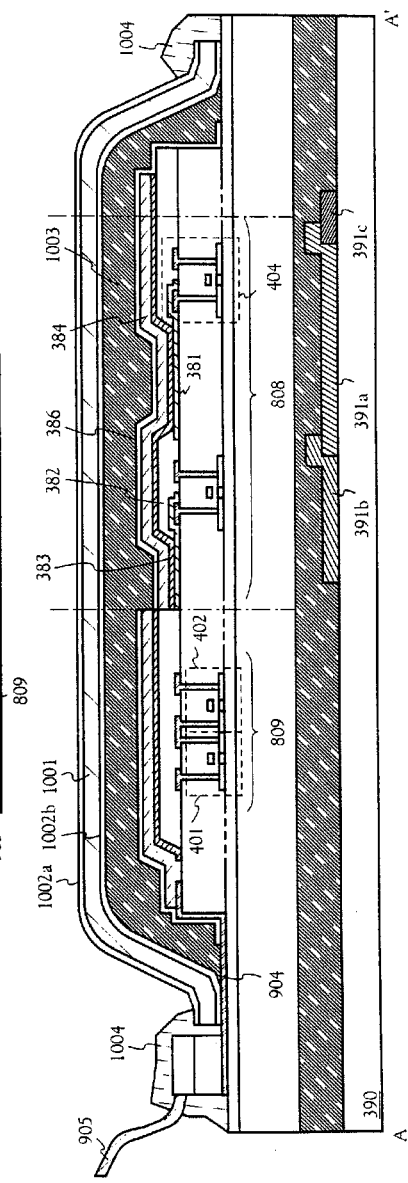

In this embodiment, a case where an EL element is sealed with the structure different from that of the EL display device in Embodiment 4 is explained with reference to FIGS. 13A to 13B. Note that the same reference symbols are used to denote the same components in FIGS. 12A and 12B.

In this embodiment, a plastic film in which DLC films 1002a and 1002b are formed on both surfaces is used as a cover member 1001. In the case where the DLC films are formed on both the surfaces of the plastic film, a roll-to-roll method, in which film deposition is performed by winding a roll with the plastic film, may be used.

In this embodiment, the cover member 1001 is bonded to the substrate in which the manufacture is completed through the EL element in accordance with Embodiment 4 by using a sealing material 1003.

Note that it is possible to implement this embodiment by freely combining it with any of the embodiment modes and Embodiments 1 to 11.

Embodiment 13

In this embodiment, the explanation is made on the circuit diagrams of the pixel structure shown in FIG. 9 in Embodiment 4 and the pixel structure shown in FIG. 15 in Embodiment 8. The circuit diagram corresponding to FIG. 9 is shown in FIG. 19A and the circuit diagram corresponding to FIG. 15 is shown in FIG. 19B.

Figure 19A:
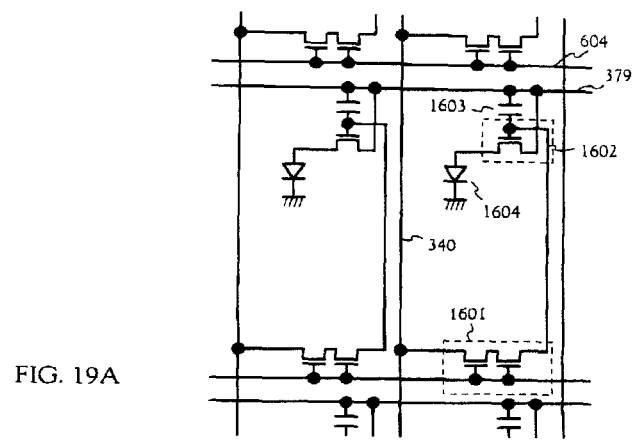
FIGS. 19A and 19B show circuit configurations of a pixel of Embodiment 13.

In FIG. 19A, reference numeral 340 denotes a source wiring, 379 denotes a current supply line, 604 denotes a gate wiring. These reference numerals correspond to those in FIG. 9. Further, reference numeral 1601 denotes the switching TFT shown in FIG. 10A, reference numeral 1603 denotes the storage capacitor shown in FIG. 10C, and 1604 denotes an EL element.

In case of digital driving of the pixel in this embodiment, the driving method disclosed in Japanese Patent Application Serial No. 2000-114592 may be referred.

Figure 19B:
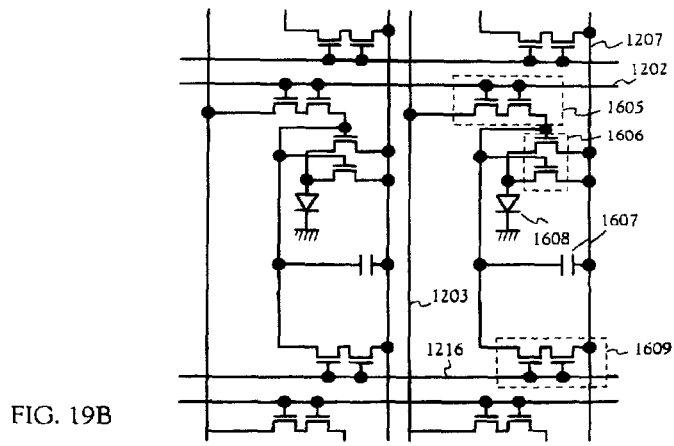

Next, in FIG. 19B, reference numeral 1203 denotes a source wiring, 1207 denotes a current supply line, and 1202 denotes a gate wiring. These reference numerals correspond to those in FIG. 15. Further, reference numeral 1605 denotes the switching TFT shown in FIG. 16A, reference numeral 1606 denotes the current control TFT shown in FIG. 16B; 1607 denotes the storage capacitor shown in FIG. 16C, 1608 denotes an EL element, and 1609 denotes an erasure TFT.

In case of digital driving of the pixel in this embodiment, the driving method disclosed in Japanese Patent Application Serial No. Hei 11-33878 may be referred.

Note that it is possible to implement this embodiment by freely combining it with any of the embodiment mode and Embodiments 2 to 12.

Embodiment 14

In this embodiment, a case where, after an active matrix substrate is completed, a substrate is exfoliated to be bonded with a color filter after is explained. Note that the process in this embodiment is effective in realizing the structure in Embodiment 3.

Figures 20A, 20B:
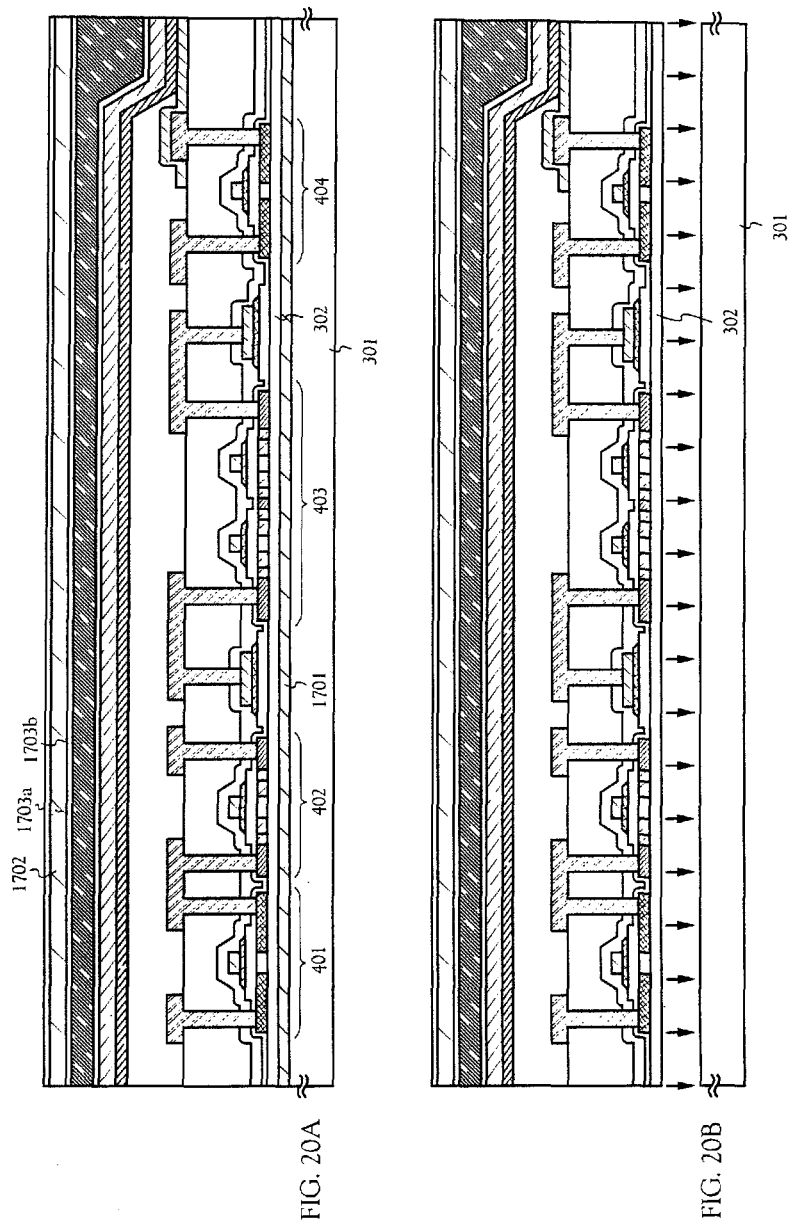
FIGS. 20A and 20B show manufacturing processes of the pixel portion of Embodiment 14.

First, the active matrix substrate with the structure shown in FIG. 7B is completed in accordance with the manufacturing process in Embodiment 4. However, a peeling layer (separating layer) 1701 is provided between a substrate 301 and a base film 302. In this embodiment, an amorphous silicon film (also, a polycrystalline film) is used as the peeling layer 1701. Further, a plastic film 1702 is used as the cover material 338, and DLC films 1703a and 1703b are provided on both surfaces of the plastic film 1702. (FIG. 20A)

Next, the entire active matrix substrate is exposed in a gas containing halogen fluoride to remove the peeling layer 1701. In this embodiment, chlorine trifluoride ($ClF_3$) is used as halogen fluoride, and nitrogen is used as a dilution gas. Argon, helium or neon may also be used as a dilution gas. The flow rate for both halogen fluoride and a dilution gas may be set to 500 sccm ($8.35 \times 10^{-6}$ m$^3$/s) and the reaction pressure may be set to 1 to 10 Torr ($1.3 \times 10^2$ to $1.3 \times 10^3$ Pa). Further, the treatment temperature may be set to a room temperature (typically 20 to 27° C.).

Note that halogen fluoride is the substance represented by a chemical formula XFn (X denotes halogen except for fluorine, and n is an integer), and chlorine fluoride (ClF), chlorine trifluoride ($ClF_3$), bromine fluoride (BrF), bromine trifluoride ($BrF_3$), iodine fluoride (IF) or iodine trifluoride ($IF_3$) can be used. Halogen fluoride has a large selection ratio in etching of a silicon film and a silicon oxide film, and the selective etching of the silicon film is possible.

In this case, the silicon film as the peeling layer is etched, but other portions exposed to gas (exposed portions of a carbon film, a plastic film, a glass substrate, a resin film and a silicon oxide film) are not etched. Namely, the peeling layer 1701 is selectively etched by being exposed to a chlorine trifluoride gas, and is finally and completely removed.

In this embodiment, the peeling layer 1701 is gradually etched from the exposed end portion, and at the point in time when the peeling layer 1701 is completely removed, the substrate 301 and the base film 302 are separated. At this point, the TFT and the EL element are formed by laminating thin films, and remain in the state that they are moved in the plastic film 1702. (FIG. 20B)

As to the peeling technique, the technique described in Japanese Patent Application Serial No. 2000-008403 by the applicant may be referred. The technique disclosed in Japanese Patent Application Serial No. 2000-071673 may also be referred.

Figure 21:
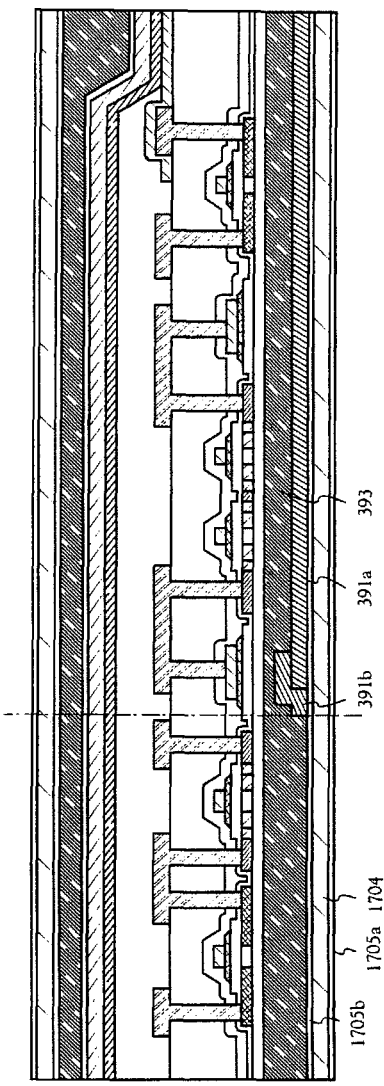
FIG. 21 shows a cross sectional structure of the pixel portion of Embodiment 14.

Next, as shown in FIG. 21, DLC films 1705a and 1705b are provided on both surfaces of a plastic film 1704, a coloring layer (R) 391a and a coloring layer (B) 391b are formed thereon, and a resin layer 393 is formed to form a color filter. Then, the color filter is bonded to the base film 302.

In this embodiment, the TFT and the EL element are sandwiched by the plastic film, and thus, the light emitting device as a whole has flexibility. Further, all the substrates are formed of a plastic films, and a thin and lightweight EL emitting device is obtained.

Embodiment 15

Figure 22:
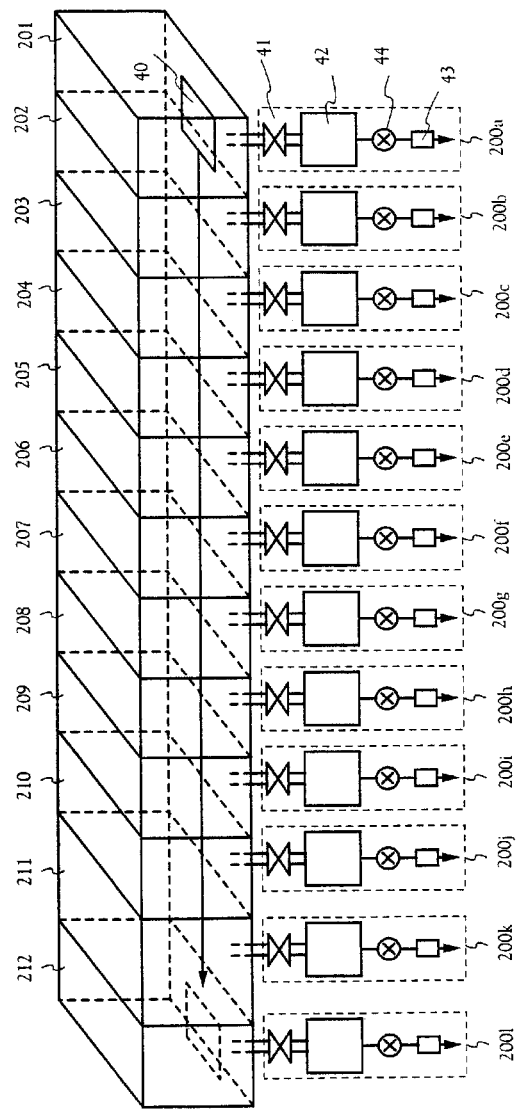
FIG. 22 shows a structure of a film forming device of an in-line system of Embodiment 15.

An example of a film forming device used for forming an EL element in implementing the present invention is shown in FIG. 22. Note that a case of a film forming device of an in-line system is explained in this embodiment. In FIG. 22, reference numeral 201 denotes a load chamber, and the conveyance of a substrate 40 starts from here. The load chamber 201 is provided with an exhaust system 200a, and the exhaust system 200a is composed of a first valve 41, a turbo molecular pump 42, a second valve 43 and a rotary pump (oil rotary pump) 44.

The first valve 41 is a main valve and may serve also as a conductance valve, or a butterfly valve may be used. The second valve 43 is a fore valve. First, the second valve 43 is opened and the load chamber 201 is roughly decompressed by the rotary pump 44. Next, the first valve 41 is opened and the load chamber 201 is decompressed to high vacuum by the turbo molecular pump 42. Note that a mechanical booster pump or a cryopump can be used instead of the turbo molecular pump, and the cryopump is particularly effective in removing moisture.

Next, denoted by reference numeral 202 is a pre-process chamber for processing an anode or a cathode of an EL element (an anode in this embodiment), which is provided with an exhaust system 200b. Further, the pre-process chamber 202 is sealingly shut off from the load chamber 201 by agate (not shown). The pre-process chamber 202 may be variously changed in accordance with the manufacturing process of the EL element.

As a pre-process, an ozone plasma process, an oxygen plasma process, an argon plasma process, a neon plasma process, a helium plasma process or a hydrogen plasma process may be conducted. Further, heating is possible together with the plasma process by providing a heater. In addition, it is effective that ultraviolet light irradiation is made possible by providing an ultraviolet light lamp.

In this embodiment, the pre-process is performed, which removes moisture and also enhances the work function of the surface of the anode by conducting the ozone plasma process to the surface of the anode consisted of an conductive oxide film while heating the substrate at 100° C.

Next, reference numeral 203 denotes an evaporation chamber for depositing an organic material by an evaporation method and is called an evaporation chamber (A). The evaporation chamber (A) 203 is provided with an exhaust system 200c and is sealingly shut off from the pre-process chamber 202 by a gate (not shown). In this embodiment, a hole injecting layer is formed in the evaporation chamber (A) 203.

Then, reference numeral 204 denotes an evaporation chamber for depositing an organic material by the evaporation method and is called an evaporation chamber (B). The evaporation chamber (B) 204 is provided with an exhaust system 200d and is sealingly shut off from the evaporation chamber (A) 203 by a gate (not shown). In this embodiment, a hole transporting layer is formed in the evaporation chamber (B) 204.

Next, reference numeral 205 denotes an evaporation chamber for depositing an organic EL material by the evaporation method and is called an evaporation chamber (C). The evaporation chamber (C) 205 is provided with an exhaust system 200e and is sealingly shut off from the evaporation chamber (B) 204 by a gate (not shown). In this embodiment, a light emitting layer for luminescing red color is formed in the evaporation chamber (C) 205.

Then, reference numeral 206 denotes an evaporation chamber for depositing an organic EL material by the evaporation method and is called an evaporation chamber (D). The evaporation chamber (D) 206 is provided with an exhaust system 200f and is sealingly shut off from the evaporation chamber (C) 205 by a gate (not shown). In this embodiment, a light emitting layer for luminescing green color is formed in the evaporation chamber (D) 206.

Then, reference numeral 207 denotes an evaporation chamber for depositing an organic EL material by the evaporation method and is called an evaporation chamber (E). The evaporation chamber (E) 207 is provided with an exhaust system 200g and is sealingly shut off from the evaporation chamber (D) 206 by a gate (not shown). In this embodiment, a light emitting layer for luminescing blue color is formed in the evaporation chamber (E) 207.

Next, reference numeral 208 denotes an evaporation chamber for depositing an organic material by the evaporation method and is called an evaporation chamber (F). The evaporation chamber (F) 208 is provided with an exhaust system 200h and is sealingly shut off from the evaporation chamber (E) 207 by a gate (not shown). In this embodiment, an electron transporting layer is formed in the evaporation chamber (F) 208.

Then, reference numeral 209 denotes an evaporation chamber for depositing an organic material by the evaporation method and is called an evaporation chamber (G). The evaporation chamber (G) 209 is provided with an exhaust system 200i and is sealingly shut off from the evaporation chamber (F) 208 by a gate (not shown). In this embodiment, an electron injecting layer is formed in the evaporation chamber (G) 209.

Then, reference numeral 210 denotes an evaporation chamber for depositing a conductive film that becomes the anode or cathode of the EL element (a metal film that becomes of the cathode in this embodiment) by the evaporation method and is called an evaporation chamber (H). The evaporation chamber (H) 210 is provided with an exhaust system 200j and is sealingly shut off from the evaporation chamber (G) 209 by a gate (not shown).

In this embodiment, an Al—Li alloy film (an alloy film of aluminum and lithium) or an Al—Cs alloy film (an alloy film of aluminum and cesium) is formed as the conductive film that becomes the cathode of the EL element in the evaporation chamber (H) 210. Note that coevaporation of aluminum and an element belonging to Group 1 or Group 2 of the periodic table is possible.

Next, reference numeral 211 denotes a sealing chamber. The sealing chamber 211 is provided with an exhaust system 200k and is sealingly shut off from the evaporation chamber (H) 210 by a gate (not shown). A DLC (diamond like carbon) film is formed as a passivation film in the sealing chamber 211 in order to protect the EL element against oxygen and moisture.

A sputtering method or a plasma CVD method may be used for forming the DLC film. The DLC film can be formed in the temperature range of from a room temperature to 100° C. Thus, the DLC film is preferable as the passivation film that protects the EL element with low heat-resistance. Further, since this film has the high heat conductivity and good heat radiation effect, the effect of suppressing heat deterioration of the EL element may be expected. Note that it is effective that the DLC film formed in this embodiment is used by being laminated with a silicon nitride film or a silicon carbide film.

Further, fluorine or hydrogen may be added into the DLC film. In addition, the transmissivity of oxygen can be reduced by setting the oxygen concentration in the DLC film to $1 \times 10^{18}$ atoms/cm$^3$.

Finally, reference numeral 212 denotes an unload chamber, which is provided with an exhaust system 200l. The substrate with the formed EL element is taken out from here.

As described above, the EL element is not exposed to the atmosphere until it is completely sealed in an airtight space by using the film forming device shown in FIG. 22. Thus, an EL display device with high reliability can be manufactured. Further, the EL display device can be manufactured with high throughput by using an in-line system.

Further, it is effective that the respective chambers, exhaust systems and conveyance systems of the film forming device in this embodiment are operated under the computer control. In case of this embodiment, the EL element is completed by conducting a series of processes in succession, and therefore, the computer control can manage from putting in the substrate to taking out the substrate.

Note that any of the EL display device shown in the embodiment mode and Embodiments 1 to 14 may be manufactured by using the film forming device in this embodiment.

Embodiment 16

In the present invention, external luminous quantum efficiency can be remarkably improved by using an EL material which can use phosphorescence from a triplet excitation for light emission. Thus, it becomes possible to realize low power consumption, long lifetime, and light weight of the EL element.

Here, there is a report in which the triplet excitation is used and the external luminous quantum efficiency is improved.

(T. Tsutsui, C. Adachi, S. Saito, Photochemical Processes in Organized Molecular Systems, ed. K. Honda, (Elsevier Sci. Pub., Tokyo, 1991) p. 437.)

A molecular formula of an EL material (coumarin pigment) reported in the above paper is as follows:

[CHEMICAL FORMULA 1]

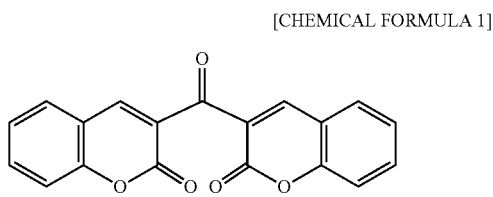 [SMILES: O=C(c1cc2ccccc2oc1=O)c1cc2ccccc2oc1=O]

[CHEMICAL FORMULA 1]
(M. A. Baldo, D. F. O'Brien, Y. You, A. Shoustikov, S. Sibley, M. E. Thompson, S. R. Forrest, Nature 395 (1988) p. 151.)

A molecular formula of an EL material (Pt complex) reported in the above paper is as follows:

[CHEMICAL FORMULA 2]

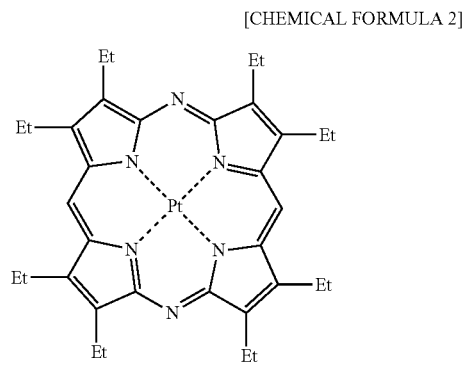

[CHEMICAL FORMULA 2]
(M. A. Baldo, S. Lamansky, P. E. Burrrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tusji, Y. Fukuda, T. Wakimoto, S. Mayaguchi, Jpn. Appl. Phys., 38 (12B) (1999) L1502.)

A molecular formula of an EL material (Ir complex) reported in the above paper is as follows:

[CHEMICAL FORMULA 3]

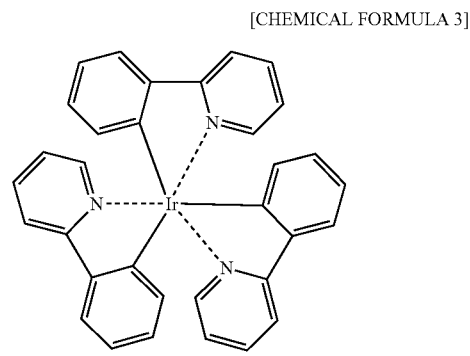

[CHEMICAL FORMULA 3]

As described above, if phosphorescence emission from the triplet excitation can be used, in principle, it becomes possible to realize the external luminous quantum efficiency 3 to 4 times as high as that in the case of using fluorescence emission from a single excitation. Note that it is possible to implement this embodiment by freely combining it with any of the embodiment modes and Embodiments 1 to 15.

Embodiment 17

In this embodiment, a specific example of the EL element 385 shown in FIG. 7B in Embodiment 4 is explained with reference to FIGS. 23A to 23F. Note that the example of the structure of the EL element in this embodiment corresponds to the enlarged example of the part of the EL element 385 in FIG. 7B. Note also that well-known organic materials or inorganic materials may be used for the material for forming an EL layer in this embodiment. Further, high molecular weight type materials and low molecular weight type materials may be used.

Figure 23A:
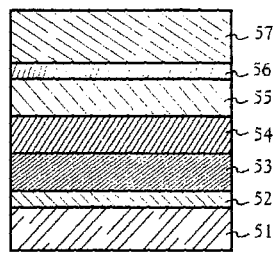
FIGS. 23A to 23F show structures of an EL element of Embodiment 17.

First, FIG. 23A shows an EL element with the structure in which a hole injecting layer 52, a hole transporting layer 53, a light emitting layer 54, an electron transporting layer 55, an electron injecting layer 56 and a cathode 57 are laminated on an anode (pixel electrode) 51. Note that the light emitting layer 54 may be constituted of three kinds of light emitting layers corresponding to the colors of red, green and blue.

In this embodiment, the improvement of the surface of the anode 51 is conducted in the pre-process chamber 202, the hole injecting layer 52 is formed in the evaporation chamber (A) 203, the hole transporting layer 53 is formed in the evaporation chamber (B) 204, the light emitting layer 54 is formed in the evaporation chamber (C) 205, the evaporation chamber (D) 206 and the evaporation chamber (E) 207, the electron transporting layer 55 is formed in the evaporation chamber (F) 208, the electron injecting layer 56 is formed in the evaporation chamber (G) 209, and the cathode 57 is formed in the evaporation chamber (H) 210.

Figure 23B:
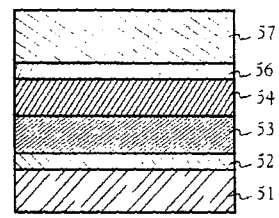

Next, FIG. 23B shows an EL element with the structure in which the hole injecting layer 52, the hole transporting layer 53, the light emitting layer 54, the electron injecting layer 56 and the cathode 57 are laminated on the anode (pixel electrode) 51. Note that the light emitting layer 54 may be constituted of three kinds of light emitting layers corresponding to the colors of red, green and blue.

In this embodiment, the improvement of the surface of the anode 51 is conducted in the pre-process chamber 202, the hole injecting layer 52 is formed in the evaporation chamber (A) 203, the hole transporting layer 53 is formed in the evaporation chamber (B) 204, the light emitting layer 54 is formed in the evaporation chamber (C) 205, the evaporation chamber (D) 206 and the evaporation chamber (E) 207, the evaporation chamber (F) 208 is passed, the electron injecting layer 56 is formed in the evaporation chamber (G) 209, and the cathode 57 is formed in the evaporation chamber (H) 210.

Figure 23C:
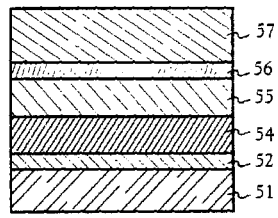

Next, FIG. 23C shows an EL element with the structure in which the hole injecting layer 52, the light emitting layer 54, the electron transporting layer 55, the electron injecting layer 56 and the cathode 57 are laminated on the anode (pixel electrode) 51. Note that the light emitting layer 54 may be constituted of three kinds of light emitting layers corresponding to the colors of red, green and blue.

In this embodiment, the improvement of the surface of the anode 51 is conducted in the pre-process chamber 202, the hole injecting layer 52 is formed in the evaporation chamber (A) 203, the evaporation chamber (B) 204 is passed, the light emitting layer 54 is formed in the evaporation chamber (C) 205, the evaporation chamber (D) 206 and the evaporation chamber (E) 207, the electron transporting layer 55 is formed in the evaporation chamber (F) 208, the electron injecting layer 56 is formed in the evaporation chamber (G) 209, and the cathode 57 is formed in the evaporation chamber (H) 210.

Figure 23D:
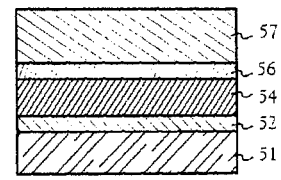

Next, FIG. 23D shows an EL element with the structure in which the hole injecting layer 52, the light emitting layer 54, the electron injecting layer 56 and the cathode 57 are laminated on the anode (pixel electrode) 51. Note that the light emitting layer 54 may be constituted of three kinds of light emitting layers corresponding to the colors of red, green and blue.

In this embodiment, the improvement of the surface of the anode 51 is conducted in the pre-process chamber 202, the hole injecting layer 52 is formed in the evaporation chamber (A) 203, the evaporation chamber (B) 204 is passed, the light emitting layer 54 is formed in the evaporation chamber (C) 205, the evaporation chamber (D) 206 and the evaporation chamber (E) 207, the evaporation chamber (F) 208 is passed, the electron injecting layer 56 is formed in the evaporation chamber (G) 209, and the cathode 57 is formed in the evaporation chamber (H) 210.

Figure 23E:
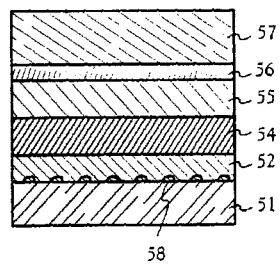

Next, FIG. 23E shows an EL element with the structure in which a cluster 58, the hole injecting layer 52, the light emitting layer 54, the electron transporting layer 55, the electron injecting layer 56 and the cathode 57 are laminated on the anode (pixel electrode) 51. Note that the light emitting layer 54 may be constituted of three kinds of light emitting layers corresponding to the colors of red, green and blue. Further, the cluster 58 is provided to enhance the work function of the anode 51. In this embodiment, iridium, nickel or platinum is provided in the form of a cluster. The cluster 58 is preferably set to 10 to 100 nm in diameter and 5 to 50 nm in height.

In this embodiment, the improvement of the surface of the anode 51 is conducted in the pre-process chamber 202, the cluster 58 is formed in the evaporation chamber (A) 203, the hole injecting layer 52 is formed in the evaporation chamber (B) 204, the light emitting layer 54 is formed in the evaporation chamber (C) 205, the evaporation chamber (D) 206 and the evaporation chamber (E) 207, the electron transporting layer 55 is formed in the evaporation chamber (F) 208, the electron injecting layer 56 is formed in the evaporation chamber (G) 209, and the cathode 57 is formed in the evaporation chamber (H) 210.

Figure 23F:
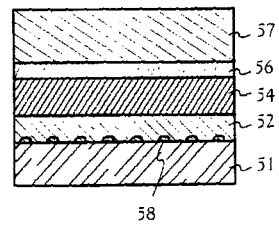

Next, FIG. 23F shows an EL element with the structure in which the cluster 58, the hole injecting layer 52, the light emitting layer 54, the electron injecting layer 56 and the cathode 57 are laminated on the anode (pixel electrode) 51. Note that the light emitting layer 54 may be constituted of three kinds of light emitting layers corresponding to the colors of red, green and blue.

In this embodiment, the improvement of the surface of the anode 51 is conducted in the pre-process chamber 202, the cluster 58 is formed in the evaporation chamber (A) 203, the hole injecting layer 52 is formed in the evaporation chamber (B) 204, the light emitting layer 54 is formed in the evaporation chamber (C) 205, the evaporation chamber (D) 206 and the evaporation chamber (E) 207, the evaporation chamber (F) 208 is passed, the electron injecting layer 56 is formed in the evaporation chamber (G) 209, and the cathode 57 is formed in the evaporation chamber (H) 210.

As described above, also in the case where the EL elements with various structures are formed, the EL elements may be easily manufactured by using the film forming device shown in FIG. 22. Note that it is possible to implement this embodiment by combining it with any of the embodiment modes and Embodiments 1 to 15.

Embodiment 18

The light emitting device manufactured by implementing the present invention is a self-light emitting device. Thus, the light emitting device is excellent in visibility in the light compared with a liquid crystal display device and has a wide viewing angle. Accordingly, it can be used as display portions of various electric apparatus. At this point, the light emitting device of the present invention is enabled to have a large-sized screen by reducing the wiring resistance even if it may be a passive type light emitting device. Thus, the wide application range of the light emitting device of the present invention may be attained.

Given as an example of such electric apparatuses are a video camera, a digital camera, a goggle type display (a head mount display), a navigation system for vehicles, a car audio system, a note-type personal computer, a game machine, a portable information terminal (such as a mobile computer, a cellular phone, portable game machine, or an electronic book), and an image reproducing machine provided with a recording medium (specifically, equipment provided with a display for replaying a recording medium such as a compact disc (CD), a laser disc (LD), or a digital versatile disk (DVD) to display images recorded in the medium). Some of these electric apparatuses are shown in FIGS. 24A to 24F and FIGS. 25A and 25B.

Figure 24A:
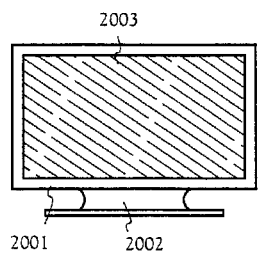
FIGS. 24A to 24F show specific examples of electric apparatus of Embodiment 18.

FIG. 24A shows an EL display having a casing 2001, a support stand 2002, a display portion 2003 and the like. The light-emitting device of the present invention can be used as the display portion 2003. The EL display is a self-emitting type so that a back light is not necessary. Thus, the display portion can be made thinner than that of a liquid crystal display.

Figure 24B:
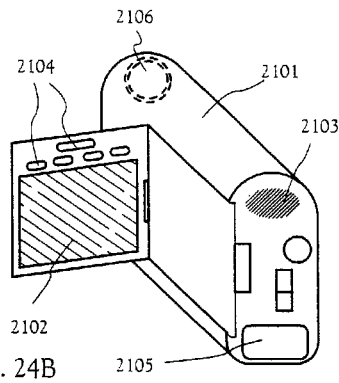

FIG. 24B shows a video camera, and contains a main body 2101, a display portion 2102, a sound input portion 2103, operation switches 2104, a battery 2105, an image receiving portion 2106 and the like. The light-emitting device of the present invention can be used as the display portion 2102.

Figure 24C:
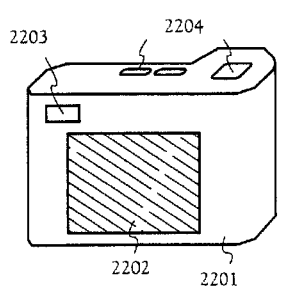

FIG. 24C shows a digital camera, and contains a main body 2201, a display portion 2202, an eye contact portion 2203, and operation switches 2204. The light-emitting device of the present invention can be used as the display portion 2202.

Figure 24D:
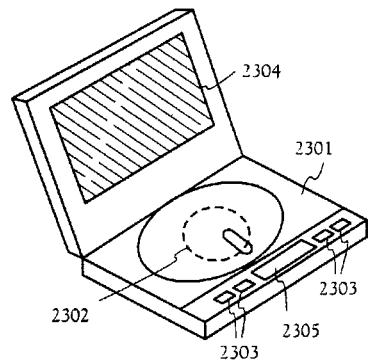

FIG. 24D is an image playback device equipped with a recording medium (specifically, a DVD playback device), and contains a main body 2301, a recording medium (such as CD, LD, or DVD) 2302, operation switches 2303, a display portion (a) 2304, a display portion (b) 2305. The display portion (a) is mainly used for displaying image information. The display portion (b) is mainly used for displaying character information. The light-emitting device of the present invention can be used as the display portions (a) and (b). Note that the image playback device equipped with the recording medium includes devices such as a CD play back device and a game machine.

Figure 24E:
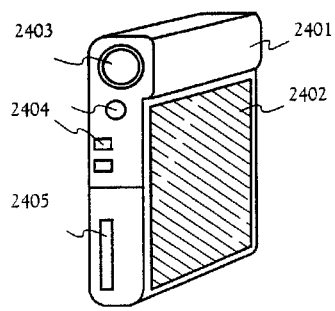

FIG. 24E shows a mobile computer, which includes a main body 2401, a display portion 2402, a image receiving portion 2403, operation switches 2404, and a memory slot 2405. The electro optical device of the present invention may be used in the display portion 2402. This mobile computer can record information in a recording medium in which flash memories or non-volatile memories are integrated and reproduce the information.

Figure 24F:
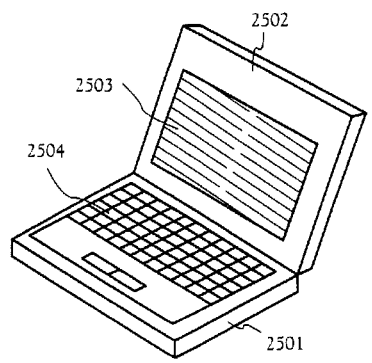

FIG. 24F is a personal computer, and contains a main body 2501, a casing 2502, a display portion 2503, a keyboard 2504 and the like. The light-emitting device of the present invention can be used as the display portion 2503.

Note that if the luminance intensity increases in the future, then it will become possible to use the light-emitting device of the present invention in a front type or a rear type projector by expanding and projecting light containing output image information with a lens, or the like.

Further, the electronic device displays information forwarded through an electronic communication line such as the Internet or a CATV (cable TV) in many cases. In particular, the electronic device has the increased opportunities of displaying dynamic image information. Since the response speed of an EL material is very fast, the electronic device is suitable for the display of dynamic images.

In addition, since the light-emitting device consumes power in the light emitting portion, it is preferable to display information so as to make the light emitting portion as small as possible. Consequently, when using the light-emitting device in a display portion mainly for character information, such as in a portable information terminal, in particular a cellular phone or a car audio, it is preferable to drive the light-emitting device so as to form character information by the light emitting portions while non-light emitting portions are set as background.

Figure 25A:
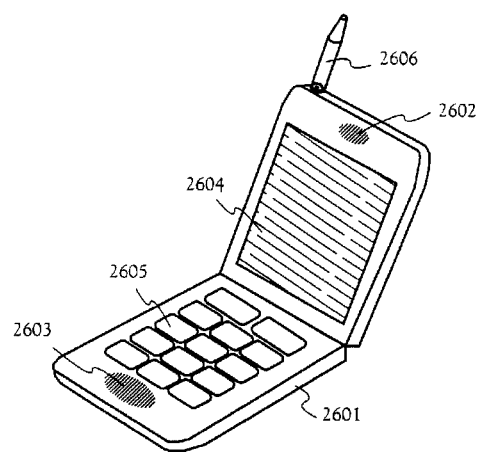
FIGS. 25A and 25B show specific examples of electric apparatus of Embodiment 18.

FIG. 25A shows a cellular phone, and contains a main body 2601, a sound output portion 2602, a sound input portion 2603, a display portion 2604, operation switches 2605, and an antenna 2606. The light-emitting device of the present invention can be used as the display portion 2604. Note that by displaying white color characters in a black color background, the display portion 2604 can suppress the power consumption of the cellular phone.

Figure 25B:
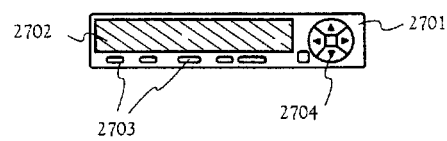

FIG. 25B shows a car audio system (audio system for vehicle), and contains a main body 2701, a display portion 2702, and operation switches 2703 and 2704. The light-emitting device of the present invention can be used as the display portion 2702. Further, the car audio system for vehicle is shown in this embodiment, but the light emitting device of the present invention may be used for a household audio playback device. Note that by displaying white color characters in a black color background, the display portion 2704 can suppress the power consumption.

Furthermore, it is effective that the car audio system is provided with the function of modulating emission luminance in accordance with the brightness of an environment for use by incorporating an optical sensor therein and providing means for detecting the brightness of an environment for use. A user can recognize an image or character information without problems if the brightness with the contrast ratio of 100 to 150 is secured compared with the brightness of an environment for use. That is, it is possible that the luminance of an image is raised in the case where the environment for use is in the light to make the image easily viewed and that the luminance of an image is suppressed in the case where the environment for use is in the dark to suppress the power consumption.

As described above, the application range of the present invention is extremely wide, whereby it may be employed in electric apparatuses of all fields. Further, the electric apparatuses of this embodiment may be obtained by employing the EL light-emitting devices in which the structures described in Embodiment Mode, and Embodiments 1 through 17 are freely combined.

The active matrix substrate or passive matrix substrate and a color filter are manufactured by separate manufacturing processes by implementing the present invention. Thus, the yield of the light emitting device as a whole can be improved, and further, the manufacture period of the light emitting device can be shortened. As a result, the manufacturing cost is reduces, whereby the light emitting device can be provided at a low price. Further, the inexpensive light emitting device is used, whereby in electric equipment can be provided at a low price.

What claimed is:

1. A method of manufacturing a light emitting device, the method comprising the steps of:
   forming a base film over a first substrate;
   forming a light emitting element over the base film;
   providing a second substrate over the light emitting element;
   separating the first substrate from the base film; and
   bonding a color filter to the base film after the separating step by forming a resin layer between the color filter and the base film,
   wherein the base film is an inorganic insulating film containing silicon, nitrogen and oxygen,
   wherein the resin layer is in direct contact with the color filter and the base film, and
   wherein the color filter comprises a flexible film and a colored layer provided on the flexible film.

2. The method according to claim 1, wherein the light emitting element emits white color light.

3. The method according to claim 1, wherein light emitted from the light emitting element is passed through the base film and the color filter.

4. The method according to claim 1, wherein the colored layer includes a red colored layer, a green colored layer and a blue colored layer.

5. The method according to claim 4, wherein at least two of the red colored layer, the green colored layer and the blue colored layer overlap with each other.

6. The method according to claim 1, wherein the light emitting element includes Ir complex.

7. The method according to claim 1, wherein the light emitting device is flexible.

8. The method according to claim 1, wherein the color filter is bonded to the base film on a side of the base film opposite to a side on which the light emitting element is located.

9. A method of manufacturing a light emitting device, the method comprising the steps of:
   forming a base film over a first substrate;
   forming a transistor over the base film;
   forming a light emitting element electrically connected to the transistor;
   providing a second substrate over the light emitting element;
   separating the first substrate from the base film; and
   bonding a color filter to the base film after the separating step by forming a resin layer between the color filter and the base film,
   wherein the base film is an inorganic insulating film containing silicon, nitrogen and oxygen,
   wherein the resin layer is in direct contact with the color filter and the base film, and
   wherein the color filter comprises a flexible film and a colored layer provided on the flexible film.

10. The method according to claim 9, wherein the light emitting element emits white color light.

11. The method according to claim 9, wherein light emitted from the light emitting element is passed through the base film and the color filter.

12. The method according to claim 9, wherein the colored layer includes a red colored layer, a green colored layer and a blue colored layer.

13. The method according to claim 9, wherein at least two of the red colored layer, the green colored layer and the blue colored layer overlap with each other.

14. The method according to claim 9, wherein the light emitting element includes Ir complex.

15. The method according to claim 9, wherein the light emitting device is flexible.

16. The method according to claim 9, wherein the color filter is bonded to the base film on a side of the base film opposite to a side on which the light emitting element is located.

17. A method of manufacturing a light emitting device, the method comprising the steps of:
- forming a light emitting element over a base film provided on a first substrate;
- providing a second substrate over the light emitting element;
- separating the first substrate from base film; and
- bonding, after the separating step, a third substrate provided with a colored layer to the second substrate with the light emitting element and the colored layer interposed therebetween by forming a resin layer between the third substrate and the base film,
- wherein the base film is an inorganic insulating film containing silicon, nitrogen and oxygen, and
- wherein the resin layer is in direct contact with the colored layer and the base film.

18. The method according to claim 17, wherein the light emitting element emits white color light.

19. The method according to claim 17, wherein light emitted from the light emitting element is passed through the colored layer and the third substrate.

20. The method according to claim 17, wherein the colored layer includes a red colored layer, a green colored layer and a blue colored layer.

21. The method according to claim 20, wherein at least two of the red colored layer, the green colored layer and the blue colored layer overlap with each other.

22. The method according to claim 17, wherein the light emitting element includes Ir complex.

23. The method according to claim 17, wherein the light emitting device is flexible.

24. A method of manufacturing a light emitting device, the method comprising the steps of:
- forming a transistor over a base film provided on a first substrate;
- forming a light emitting element electrically connected to the transistor;
- providing a second substrate over the light emitting element;
- separating the first substrate from the base film; and
- bonding, after the separating step, a third substrate provided with a colored layer to the second substrate with the transistor, the light emitting element and the colored layer interposed therebetween by forming a resin layer between the base film and the third substrate,
- wherein the base film is an inorganic insulating film containing silicon, nitrogen and oxygen, and
- wherein the resin layer is in direct contact with the colored layer and the base film.

25. The method according to claim 24, wherein the light emitting element emits white color light.

26. The method according to claim 24, wherein light emitted from the light emitting element is passed through the colored layer and the third substrate.

27. The method according to claim 24, wherein the colored layer includes a red colored layer, a green colored layer and a blue colored layer.

28. The method according to claim 27, wherein at least two of the red colored layer, the green colored layer and the blue colored layer overlap with each other.

29. The method according to claim 24, wherein the light emitting element includes Ir complex.

30. The method according to claim 24, wherein the light emitting device is flexible.

* * * * *